US012575460B2

(12) United States Patent
Ono et al.

(10) Patent No.: US 12,575,460 B2
(45) Date of Patent: Mar. 10, 2026

(54) HIGH FREQUENCY MODULE AND COMMUNICATION APPARATUS

(71) Applicant: Murata Manufacturing Co., Ltd., Nagaokakyo (JP)

(72) Inventors: Atsushi Ono, Nagaokakyo (JP); Masanori Kishimoto, Nagaokakyo (JP); Yoshiaki Sukemori, Nagaokakyo (JP); Yoshiki Kogushi, Nagaokakyo (JP); Kenichi Shimamoto, Nagaokakyo (JP); Hisanori Namie, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 438 days.

(21) Appl. No.: 18/459,440

(22) Filed: Sep. 1, 2023

(65) Prior Publication Data

US 2023/0411377 A1    Dec. 21, 2023

Related U.S. Application Data

(63) Continuation of application No. PCT/JP2022/008274, filed on Feb. 28, 2022.

(30) Foreign Application Priority Data

Mar. 2, 2021    (JP) ................................. 2021-033006

(51) Int. Cl.
| | | |
|---|---|---|
| *H01L 25/18* | (2023.01) | |
| *H01L 23/00* | (2006.01) | |

(Continued)

(52) U.S. Cl.
CPC ............ H01L 25/18 (2013.01); H01L 23/481 (2013.01); H01L 23/5384 (2013.01);

(Continued)

(58) Field of Classification Search
CPC ... H01L 25/18; H01L 23/481; H01L 23/5384; H01L 24/05; H01L 24/08; H01L 24/13;

(Continued)

(56) References Cited

U.S. PATENT DOCUMENTS

| | | | | |
|---|---|---|---|---|
| 11,489,547 B2 * | 11/2022 | Tsuchida | .................. | H04B 1/04 |
| 2018/0130761 A1 | 5/2018 | Kim et al. | | |

(Continued)

FOREIGN PATENT DOCUMENTS

| | | | | |
|---|---|---|---|---|
| CN | 111526227 A * | 8/2020 | ......... | H01L 23/3677 |
| JP | 2009-176994 A | 8/2009 | | |

(Continued)

OTHER PUBLICATIONS

International Search Report and Written Opinion mailed on May 17, 2022, received for PCT Application PCT/JP2022/008274, filed on Feb. 28, 2022, 12 pages including English Translation.

*Primary Examiner* — Mamadou L Diallo
(74) *Attorney, Agent, or Firm* — XSENSUS LLP

(57) ABSTRACT

A high frequency module capable of improving heat dissipation characteristics of a power amplifier and suppressing influence of heat of the power amplifier on another electronic component is provided. A high frequency module includes a mounting substrate, a power amplifier, a switch, a plurality of external connection terminals, and a connector. The mounting substrate has a first main surface and a second main surface that are opposite to each other. The power amplifier and the switch are disposed on the second main surface of the mounting substrate. The plurality of external connection terminals are disposed on the second main surface of the mounting substrate. The connector is able to be connected to an external substrate. The plurality of external connection terminals include a first external connection terminal that is connected to the connector. The first (Continued)

external connection terminal is disposed between the power amplifier and the switch.

16 Claims, 11 Drawing Sheets

(51) Int. Cl.
  *H01L 23/48*      (2006.01)
  *H01L 23/538*     (2006.01)
(52) U.S. Cl.
  CPC .............. *H01L 24/05* (2013.01); *H01L 24/08* (2013.01); *H01L 24/13* (2013.01); *H01L 24/16* (2013.01); *H01L 2224/0557* (2013.01); *H01L 2224/08238* (2013.01); *H01L 2224/13025* (2013.01); *H01L 2224/16227* (2013.01); *H01L 2924/10253* (2013.01); *H01L 2924/10329* (2013.01)
(58) Field of Classification Search
  CPC .......... H01L 24/16; H01L 2224/08238; H01L 2224/13025; H05K 1/185; H05K 3/284; H05K 1/0237
  See application file for complete search history.

(56) References Cited

U.S. PATENT DOCUMENTS

| | | | | |
|---|---|---|---|---|
| 2020/0203291 | A1* | 6/2020 | Uejima | .................... H01L 25/18 |
| 2021/0020577 | A1* | 1/2021 | Hu | ........................ H01L 25/0652 |
| 2021/0288683 | A1* | 9/2021 | Nakai | ...................... H03F 3/245 |
| 2021/0313274 | A1* | 10/2021 | Park | ......................... H01L 24/19 |
| 2022/0190849 | A1* | 6/2022 | Shinozaki | ................ H04B 1/04 |
| 2023/0035978 | A1* | 2/2023 | Oshita | ..................... H03F 3/195 |
| 2023/0043512 | A1* | 2/2023 | Lin | ...................... H01L 21/4853 |
| 2023/0188169 | A1* | 6/2023 | Sawada | .................... H04B 1/03 |
| | | | | 375/328 |
| 2023/0240000 | A1* | 7/2023 | Tanaka | ................. H03H 9/0566 |
| 2023/0328877 | A1* | 10/2023 | Yamaguchi | ............ H05K 1/185 |
| | | | | 361/761 |

FOREIGN PATENT DOCUMENTS

| | | | |
|---|---|---|---|
| JP | 2011-198866 | A | 10/2011 |
| JP | 2015-111747 | A | 6/2015 |
| JP | 2020-126921 | A | 8/2020 |
| WO | 2018/101384 | A1 | 6/2018 |
| WO | 2019/181590 | A1 | 9/2019 |
| WO | 2019/181761 | A1 | 9/2019 |
| WO | 2020/071021 | A1 | 4/2020 |
| WO | 2020/090557 | A1 | 5/2020 |
| WO | 2021/002454 | A1 | 1/2021 |

* cited by examiner

HIGH FREQUENCY MODULE AND COMMUNICATION APPARATUS

CROSS REFERENCE TO RELATED APPLICATIONS

The present application is a continuation of international application no. PCT/JP2022/008274, filed Feb. 28, 2022, which is based on, and claims priority to, Japanese Patent Application No. 2021-033006 filed on Mar. 2, 2021. The entire disclosures of the above-identified applications, including the specification, drawings and claims are incorporated herein by reference in their entirety.

BACKGROUND

Technical Field

The present disclosure relates in general to a high frequency module and a communication apparatus and more particularly to a high frequency module including a power amplifier and a first electronic component and a communication apparatus including the high frequency module.

Description of the Related Art

A high frequency module described in Patent Document 1 includes a mounting substrate, a power amplifier, a reception filter (first electronic component), a metal block, and a terminal (connecting member). The power amplifier is disposed on a first main surface of the mounting substrate. The terminal, the reception filter, and the metal block are disposed on a second main surface of the mounting substrate. The power amplifier is connected to the metal block with a via, which is arranged inside the mounting substrate, interposed therebetween. The metal block is connected to the terminal. In this high frequency module, heat generated at the power amplifier is dissipated, through the via inside the mounting substrate, the metal block, and the terminal, to an external substrate that is connected to the terminal.

CITATION LIST

Patent Document

Patent Document 1: Japanese Unexamined Patent Application Publication No. 2020-126921

SUMMARY

Technical Problems

However, as recognized by the present inventor, in the high frequency module described in Patent Document 1, heat generated at the power amplifier disposed on the first main surface of the mounting substrate is transmitted to the external substrate disposed near the second main surface of the mounting substrate, and is thus dissipated. Therefore, the length of a heat dissipation path for the heat generated at the power amplifier increases, and heat dissipation characteristics of the power amplifier deteriorate. Furthermore, influence of the heat generated at the power amplifier on another electronic component (first electronic component) needs to be suppressed.

The present disclosure has been made in view of the problem described above, and the present disclosure is presented to provide a high frequency module and a communication apparatus capable of improving heat dissipation characteristics of a power amplifier and suppressing influence of heat of the power amplifier on another electronic component.

Solutions

A high frequency module according to an aspect of the present disclosure includes a mounting substrate, a power amplifier, a first electronic component, a plurality of external connection terminals, and a connecting member. The mounting substrate has a first main surface and a second main surface that are opposite to each other. The power amplifier and the first electronic component are disposed on the second main surface of the mounting substrate. The plurality of external connection terminals are disposed on the second main surface of the mounting substrate. The connecting member is able to be connected to an external substrate. The plurality of external connection terminals include a first external connection terminal connected to the connecting member. The first external connection terminal is disposed between the power amplifier and the first electronic component.

A communication apparatus according to an aspect of the present disclosure includes the high frequency module and a signal processing circuit. The signal processing circuit processes a high frequency signal passing through the high frequency module.

Advantageous Effects

The present disclosure provides an advantage of being able to improve heat dissipation characteristics of a power amplifier and suppress influence of heat of the power amplifier on another electronic component.

BRIEF DESCRIPTION OF DRAWINGS

FIG. 6 is a cross-section view of a main part of a high frequency module according to Modification 1.

FIG. 7 is a cross-section view of a main part of a high frequency module according to Modification 5.

FIG. 8 is a cross-section view of a main part of a high frequency module according to Modification 6.

FIG. 9 is a cross-section view of a main part of a high frequency module according to Modification 7.

FIG. 10 is a cross-section view of a main part of a high frequency module according to Modification 8.

FIG. 11 is a partially enlarged view of FIG. 10.

DETAILED DESCRIPTION

FIGS. 1 to 7 are schematic diagrams, and ratios of the sizes and the thicknesses of component elements in these figures do not necessarily correspond to the actual dimensional ratios.

Embodiments

(1) Summary

Figure 4:
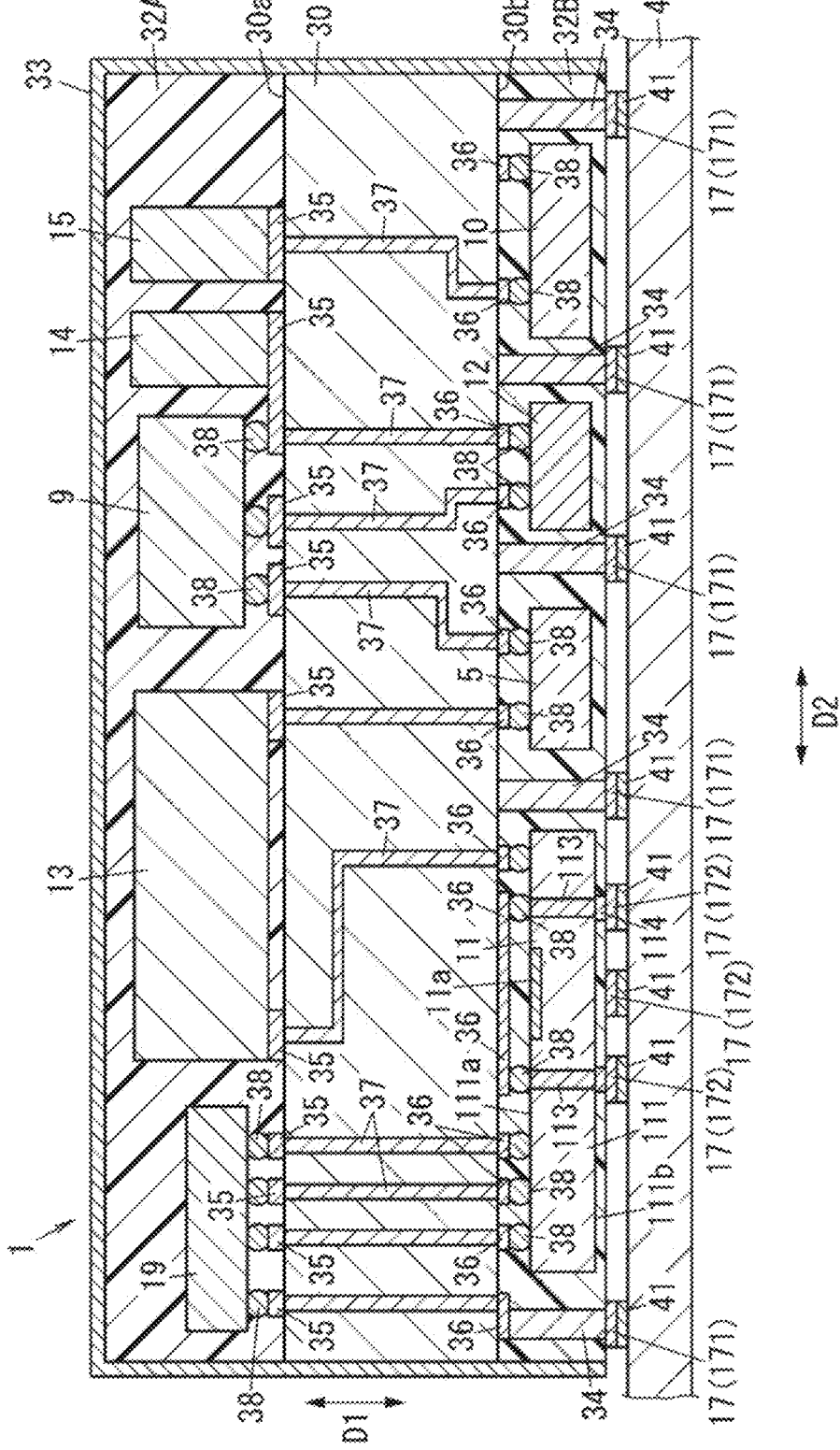
FIG. 4 is a cross-section view along line X1 -X1 of FIG. 2 and line X2-X2 of FIG. 3.

A high frequency module 1 according to an embodiment includes, as illustrated in FIG. 4, a mounting substrate 30, a power amplifier 11, a first electronic component (for example, a second switch 5), an external connection terminal 34, and a plurality of connecting members 17. The mounting substrate 30 has a first main surface 30a and a second main surface 30b that are opposite to each other. The power amplifier 11 and the first electronic component (for example, the second switch 5) are disposed on the second main surface 30b of the mounting substrate 30. The external connection terminal 34 is disposed on the second main surface 30b of the mounting substrate 30. The plurality of connecting members 17 are disposed near the second main surface 30b on the mounting substrate 30 and are able to be connected to an external substrate. The external connection terminal 34 is disposed between the power amplifier 11 and the first electronic component (for example, the second switch 5) on the second main surface 30b of the mounting substrate 30 and is connected to at least one of the plurality of connecting members 17. With this arrangement, heat dissipation characteristics of the power amplifier 11 can be improved, and influence of heat generated at the power amplifier 11 on the first electronic component (for example, the second switch 5) can be suppressed.

(2) Detailed Description

The high frequency module 1 and a communication apparatus 100 according to this embodiment will be described in detail below with reference to FIGS. 1 to 5.

(2-1) Configuration of Communication Apparatus

Figure 1:
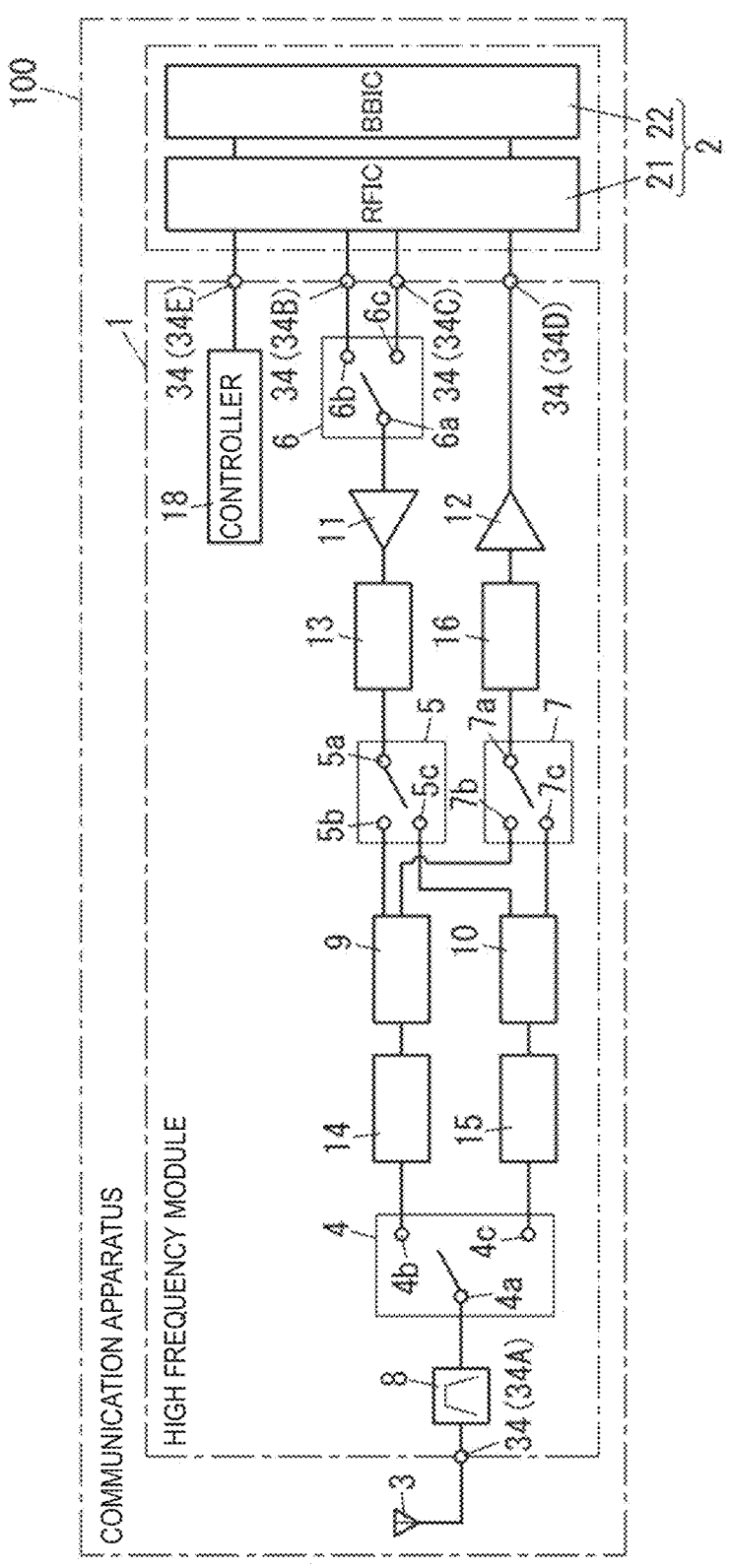
FIG. 1 is a block diagram of a high frequency module and a communication apparatus according to an embodiment.

As illustrated in FIG. 1, the communication apparatus 100 is a communication apparatus including the high frequency module 1. The communication apparatus 100 is, for example, a portable terminal (for example, a smartphone). However, the communication apparatus 100 may be a wearable terminal (for example, a smartwatch). The high frequency module 1 is, for example, a module capable of supporting 4G (fourth generation mobile communications) standards and 5G (fifth generation mobile communications) standards. The 4G standards are, for example, 3GPP LTE (Long Term Evolution) standards. The 5G standards are, for example, 5G NR (New Radio). The high frequency module 1 is, for example, a module capable of supporting carrier aggregation and dual connectivity.

The communication apparatus 100 includes, in addition to the high frequency module 1, a signal processing circuit 2 and at least one (in the illustrated example, one) antenna 3.

The high frequency module 1 is configured to amplify a reception signal (high frequency signal) received at the antenna 3 and then output the reception signal to the signal processing circuit 2. The high frequency module 1 is, for example, controlled by the signal processing circuit 2. In this embodiment, the high frequency module 1 has a reception-system signal processing function for amplifying a reception signal received at the antenna 3 and then outputting the reception signal to the signal processing circuit 2. The high frequency module 1 also has a transmission-system signal processing function for amplifying a transmission signal from the signal processing circuit 2 and then outputting the transmission signal to the antenna 3.

The signal processing circuit 2 processes high frequency signals (transmission signals and reception signals) passing through the high frequency module 1. More particularly, the signal processing circuit 2 is connected to the high frequency module 1 and is configured to perform signal processing for a reception signal received from the high frequency module 1. The signal processing circuit 2 is also configured to perform signal processing for a transmission signal to be output to the high frequency module 1. The signal processing circuit 2 includes an RF signal processing circuit 21 and a baseband signal processing circuit 22.

The RF signal processing circuit 21 is, for example, an RFIC (Radio Frequency Integrated Circuit) and performs signal processing for a high frequency signal (reception signal). For example, the RF signal processing circuit 21 performs signal processing such as down-conversion for a reception signal received from the high frequency module 1 and then outputs the signal to the baseband signal processing circuit 22. Furthermore, the RF signal processing circuit 21 performs signal processing such as up-conversion for a transmission signal output from the baseband signal processing circuit 22 and then outputs the signal to the high frequency module 1.

The baseband signal processing circuit 22 is, for example, a BBIC (Baseband Integrated Circuit). The baseband signal processing circuit 22 outputs a reception signal received from the RF signal processing circuit 21 to the outside. This output signal (reception signal) is used as an image signal for image display or used as an audio signal for conversation. Furthermore, the baseband signal processing circuit 22 generates a transmission signal from a baseband signal (for example, an audio signal or an image signal) input from the outside and then outputs the generated transmission signal to the RF signal processing circuit 21.

(2-2) (Example of Circuit Configuration of High Frequency Module)

As illustrated in FIG. 1, the high frequency module 1 transfers high frequency signals (for example, reception signals and transmission signals) to and from the antenna 3 and the signal processing circuit 2.

The high frequency module 1 includes a first switch 4, the second switch 5, a third switch 6, a fourth switch 7, a transmission/reception filter 8, and a plurality of (in FIG. 1, two) duplexers 9 and 10. The high frequency module 1 also includes the power amplifier 11, a low noise amplifier 12, an output matching circuit 13, a plurality of (in FIG. 1, three) matching circuits 14 to 16, a controller 18, and a plurality of (in FIG. 1, five) external connection terminals 34.

The plurality of external connection terminals 34 include an antenna terminal 34A, signal input terminals 34B and 34C, a signal output terminal 34D, and an input terminal 34E. The antenna terminal 34A is a terminal to which the antenna 3 is connected. Each of the signal input terminals 34B and 34C is a terminal to which a transmission signal generated by the signal processing circuit 2 is input and is connected to an output part of the signal processing circuit 2. The signal output terminal 34D is a terminal through which a reception signal processed by the high frequency module 1 is output to the signal processing circuit 2 and is connected to an input part of the signal processing circuit 2. The input terminal 34E is a terminal to which a control signal from the signal processing circuit 2 is input and is connected to the output part of the signal processing circuit 2.

The first switch 4 is a switch that allows the two duplexers 9 and 10 to be selectively connected to the antenna 3. The first switch 4 is, for example, a switch IC (Integrated Circuit). The first switch 4 includes a common terminal 4*a* and a plurality of (in FIG. 1, two) selection terminals 4*b* and 4*c*. The common terminal 4*a* is connected to the antenna terminal 34A. That is, the common terminal 4*a* is connected to the antenna 3 with the antenna terminal 34A interposed therebetween. The selection terminal 4*b* is connected to the duplexer 9 with the matching circuit 14 interposed therebetween. The selection terminal 4*c* is connected to the duplexer 10 with the matching circuit 15 interposed therebetween. The first switch 4 selects a connection destination for the common terminal 4*a* (that is, a connection destination for the antenna 3) from among the two selection terminals 4*b* and 4*c* (that is, the two duplexers 9 and 10) in accordance with a control signal from the controller 18.

The second switch 5 is a switch that allows input parts of the two duplexers 9 and 10 to be selectively connected to an output part of the power amplifier 11. The second switch 5 is, for example, a switch IC. The second switch 5 includes a common terminal 5*a* and a plurality of (in FIG. 1, two) selection terminals 5*b* and 5*c*. The common terminal 5*a* is connected to the output part of the power amplifier 11 with the output matching circuit 13 interposed therebetween. The two selection terminals 5*b* and 5*c* are connected to the input parts of the duplexers 9 and 10, respectively. The second switch 5 selects a connection destination for the common terminal 5*a* from among the two selection terminals 5*b* and 5*c* in accordance with a control signal from the controller 18.

The third switch 6 is a switch that allows the two signal input terminals 34B and 34C to be selectively connected to an input part of the power amplifier 11. The third switch 6 is, for example, a switch IC. The third switch 6 includes a common terminal 6*a* and a plurality of (in FIG. 1, two) selection terminals 6*b* and 6*c*. The common terminal 6*a* is connected to the input part of the power amplifier 11. The two selection terminals 6*b* and 6*c* are connected to the signal input terminals 34B and 34C, respectively. The third switch 6 selects a connection destination for the common terminal 6*a* from among the two selection terminals 6*b* and 6*c* in accordance with a control signal from the controller 18.

The fourth switch 7 is a switch that allows output parts of the two duplexers 9 and 10 to be selectively connected to an input part of the low noise amplifier 12. The fourth switch 7 is, for example, a switch IC (Integrated Circuit). The fourth switch 7 includes a common terminal 7*a* and a plurality of (in FIG. 1, two) selection terminals 7*b* and 7*c*. The common terminal 7*a* is connected to the input part of the low noise amplifier 12 with the matching circuit 16 interposed therebetween. The selection terminals 7*b* and 7*c* are connected to the output parts of the duplexers 9 and 10, respectively. The fourth switch 7 selects a connection destination for the common terminal 7*a* from among the two selection terminals 7*b* and 7*c* in accordance with a control signal from the controller 18.

The transmission/reception filter 8 is connected between the antenna terminal 34A and the common terminal 4*a* of the first switch 4. The transmission/reception filter 8 is a filter whose pass band is a wide communication bandwidth (first communication bandwidth). The transmission/reception filter 8 includes two input/output parts (a first input/output part and a second input/output part). The first input/output part of the transmission/reception filter 8 is connected to the antenna terminal 34A. The second input/output part of the transmission/reception filter 8 is connected to the common terminal 4*a* of the first switch 4. The transmission/reception filter 8 outputs, from the first input/output part, only transmission signals within the first communication bandwidth input to the second input/output part. Furthermore, the transmission/reception filter 8 outputs, from the second input/output part, only reception signals within the first communication bandwidth input to the first input/output part.

The duplexer 9 is connected between the matching circuit 14, the selection terminal 5*b* of the second switch 5, and the selection terminal 7*b* of the fourth switch 7. The duplexer 9 includes a transmission filter whose pass band is a transmission band (communication bandwidth) of a first communication band and a reception filter whose pass band is a reception band (communication bandwidth) of a second communication band. The first communication band and the second communication band may be the same, may be different, or may partially overlap. The duplexer 9 includes an input/output part, an input part, and an output part. The input/output part of the duplexer 9 is connected to the selection terminal 4*b* of the first switch 4 with the matching circuit 14 interposed therebetween. The input part of the duplexer 9 is connected to the selection terminal 5*b* of the second switch 5. The output part of the duplexer 9 is connected to the selection terminal 7*b* of the fourth switch 7. The duplexer 9 outputs, from the input/output part, only transmission signals within the transmission band of the first communication band input to the input part. The duplexer 9 also outputs, from the output part, only reception signals within the reception band of the second communication band input to the input/output part.

The duplexer 10 is connected between the matching circuit 15, the selection terminal 5*c* of the second switch 5, and the selection terminal 7*c* of the fourth switch 7. The duplexer 10 includes a transmission filter whose pass band is a transmission band (communication bandwidth) of a third communication band and a reception filter whose pass band is a reception band (communication bandwidth) of a fourth communication band. The third communication band and the fourth communication band may be the same, may be different, or may partially overlap. The duplexer 10 includes an input/output part, an input part, and an output part. The input/output part of the duplexer 10 is connected to the selection terminal 4*c* of the first switch 4 with the matching circuit 15 interposed therebetween. The input part of the duplexer 10 is connected to the selection terminal 5*c* of the second switch 5. The output part of the duplexer 10 is connected to the selection terminal 7*c* of the fourth switch 7. The duplexer 10 outputs, from the input/output part, only transmission signals within the transmission band of the third communication band input to the input part. The duplexer 10 also outputs, from the output part, only reception signals within the reception band of the fourth communication band input to the input/output part.

The transmission/reception filter 8 and the duplexers 9 and 10 are, for example, acoustic wave filters. The acoustic wave filters are, for example, surface acoustic wave (SAW) filters using surface acoustic waves. The transmission/reception filter 8 and the duplexers 9 and 10 are not necessarily SAW filters and may be, for example, BAW (Bulk Acoustic Wave) filters.

The power amplifier 11 is connected between the common terminal 5*a* of the second switch 5 and the common terminal 6*a* of the third switch 6. The power amplifier 11 includes the input part and the output part. The input part of the power amplifier 11 is connected to the common terminal 6a of the third switch 6. The output part of the power amplifier 11 is connected to the common terminal 5a of the second switch 5 with the output matching circuit 13 interposed therebetween. The power amplifier 11 amplifies a transmission signal input to the input part and then outputs the transmission signal from the output part. The power amplifier 11 is controlled in accordance with a control signal from the controller 18.

The low noise amplifier 12 is connected between the common terminal 7a of the fourth switch 7 and the signal output terminal 34D. The low noise amplifier 12 includes the input part and an output part. The input part of the low noise amplifier 12 is connected to the common terminal 7a of the fourth switch 7 with the matching circuit 16 interposed therebetween. The output part of the low noise amplifier 12 is connected to the signal output terminal 34D. The low noise amplifier 12 amplifies a reception signal input to the input part and then outputs the reception signal from the output part. The low noise amplifier 12 is controlled in accordance with a control signal from the controller 18.

The output matching circuit 13 is a circuit for achieving impedance matching between the power amplifier 11 and the second switch 5 and is connected between the power amplifier 11 and the second switch 5. The matching circuit 14 is a circuit for achieving impedance matching between the first switch 4 and the duplexer 9 and is connected between the first switch 4 and the duplexer 9. The matching circuit 15 is a circuit for achieving impedance matching between the first switch 4 and the duplexer 10 and is connected between the first switch 4 and the duplexer 10. The matching circuit 16 is a circuit for achieving impedance matching between the fourth switch 7 and the low noise amplifier 12 and is connected between the fourth switch 7 and the low noise amplifier 12.

The controller 18 is a control device that controls electronic components including the power amplifier 11, the low noise amplifier 12, the first switch 4, the second switch 5, the third switch 6, the fourth switch 7, and the like in accordance with control signals from the signal processing circuit 2. The controller 18 is electrically connected to the electronic components mentioned above. The controller 18 is connected to the output part of the signal processing circuit 2 with the input terminal 34E interposed therebetween. The controller 18 controls the electronic components mentioned above in accordance with control signals from the signal processing circuit 2 input to the input terminal 34E.

(2-3) Operation of Communication Apparatus

Operations of the communication apparatus 100 will be described with reference to FIG. 1.

To transmit a transmission signal, at the third switch 6, an output part (for example, an output part connected to the signal input terminal 34B) is selected out of the two output parts (output parts connected to the signal input terminals 34B and 34C) of the signal processing circuit 2. Furthermore, at each of the first switch 4 and the second switch 5, a duplexer (for example, the duplexer 9) is selected out of the two duplexers 9 and 10. Thus, for example, a transmission signal output from the output part connected to the signal input terminal 34B in the signal processing circuit 2 is transmitted through the third switch 6, the power amplifier 11, the output matching circuit 13, the second switch 5, the duplexer 9, the matching circuit 14, the first switch 4, and the transmission/reception filter 8 and is output from the antenna 3.

In the case where a reception signal is received at the antenna 3, at the first switch 4 and the fourth switch 7, a duplexer (for example, the duplexer 9) is selected out of the two duplexers 9 and 10. Thus, the reception signal received at the antenna 3 is transmitted through the antenna 3, the first switch 4, the matching circuit 14, the duplexer 9, the fourth switch 7, the matching circuit 16, and the low noise amplifier 12 and is input to the input part connected to the signal output terminal 34D in the signal processing circuit 2. Then, the reception signal is processed at the signal processing circuit 2.

(2-4) Example of Structure of High Frequency Module

Figure 2:
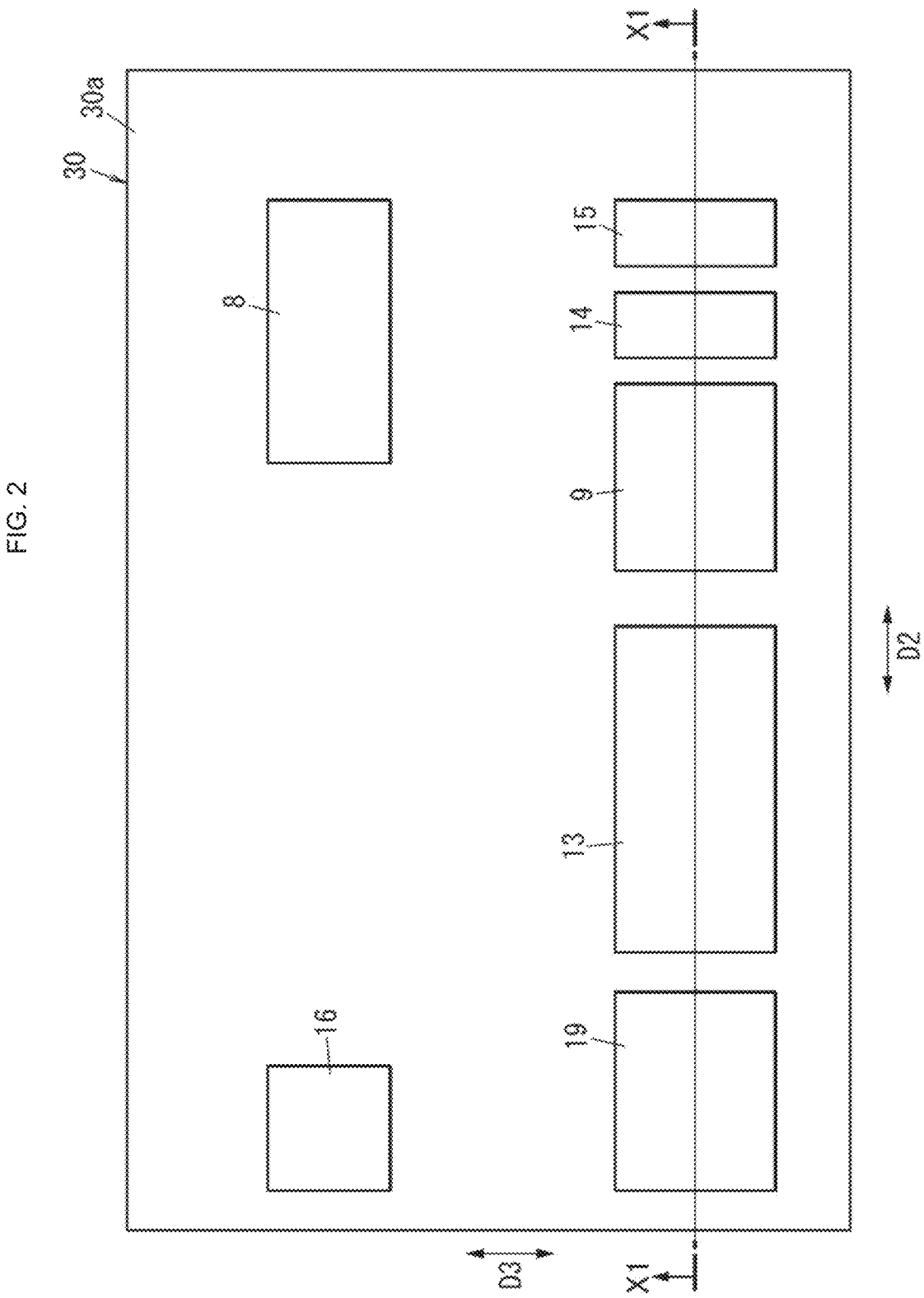
FIG. 2 is a plan view of a first main surface of a mounting substrate of the high frequency module seen from the first main surface side.

An example of the structure of the high frequency module 1 will be described with reference to FIGS. 2 to 4.

In the description provided below, as illustrated in FIG. 4, a thickness direction D1 of the mounting substrate 30 may be described as a first direction D1. Furthermore, as illustrated in FIG. 4, a direction (for example, a direction parallel to one of two pairs of opposite sides of the second main surface 30b of the mounting substrate 30) orthogonal to the first direction D1 will be described as a second direction D2. Furthermore, as illustrated in FIGS. 2 and 3, a direction (for example, direction parallel to the other one of the two pairs of the opposite sides of the second main surface 30b) orthogonal to both the first direction D1 and the second direction D2 will be defined as a third direction D3.

Furthermore, on the drawing of FIG. 4, an upper side and a lower side of the first direction D1 may be simply described as "upper side" and "lower side". On the drawing of FIGS. 2 to 4, a left side and a right side of the second direction D2 may be simply described as "left side" and "right side". On the drawing of FIGS. 2 and 3, an upper side and a lower side of the third direction D3 may be simply described as "rear side" and "front side".

As illustrated in FIG. 4, the high frequency module 1 includes the mounting substrate 30, a plurality of electronic components, resin layers 32A and 32B, a shield layer 33, the plurality of external connection terminals 34, and the plurality of connecting members 17.

The mounting substrate 30 is a substrate on which the plurality of electronic components are mounted. The mounting substrate 30 has, for example, a rectangular shape. The mounting substrate 30 has the first main surface 30a and the second main surface 30b that are opposite to each other in the thickness direction D1 of the mounting substrate 30. The first main surface 30a and the second main surface 30b each have, for example, a rectangular shape.

The mounting substrate 30 is, for example, a substrate (multilayer substrate) that includes a plurality of layers including a plurality of dielectric layers and a plurality of electroconductive layers. The plurality of dielectric layers and the plurality of electroconductive layers are laminated in the thickness direction D1 of the mounting substrate 30. The plurality of electroconductive layers are formed in predetermined patterns set for individual layers. The plurality of electroconductive layers include a ground layer. The mounting substrate 30 is, for example, an LTCC (Low Temperature Co-fired Ceramics) substrate. The mounting substrate 30 is not necessarily an LTCC substrate and may be, for example, a printed wiring board, an HTCC (High Temperature Co-fired Ceramics) substrate, or a resin multilayer substrate.

The mounting substrate 30 includes a plurality of first pads 35, a plurality of second pads 36, and a plurality of vias 37. The plurality of first pads 35 are provided on the first main surface 30a of the mounting substrate 30 and are connected to external terminals of electronic components mounted on the first main surface 30a. In this specification and the like, "A (for example, a first pad) is connected to B (for example, an external terminal of an electronic component)" does not necessarily mean a state in which A is in contact with B but also includes a state in which A and B are electrically connected with a conductor electrode, a conductor terminal, a wire, another circuit component, or the like interposed therebetween. Furthermore, the plurality of second pads 36 are provided on the second main surface 30b of the mounting substrate 30 and are electrically connected to external terminals of electronic components mounted on the second main surface 30b. The plurality of vias 37 are through electrodes that are provided inside the mounting substrate 30 so that the first pads 35 and the second pads 36 are electrically connected. The vias 37 may penetrate straight through between the first main surface 30a and the second main surface 30b of the mounting substrate 30 in the thickness direction D1 or may penetrate through between the first main surface 30a and the second main surface 30b of the mounting substrate 30 in such a manner that the vias 37 deviate along an electroconductive layer in the mounting substrate 30 while going in the thickness direction D1 of the mounting substrate 30. Hereinafter, the first pads 36 and the second pads 38 may be described as metal members 36 and metal members 38.

The plurality of electronic components include the first switch 4, the second switch 5, the third switch 6, the transmission/reception filter 8, the duplexers 9 and 10, the power amplifier 11, the low noise amplifier 12, the output matching circuit 13, the matching circuits 14 and 15, the matching circuit 16, and an IC chip 19. The IC chip 19 is a semiconductor device in which the controller 18 and the third switch 6 are integrated into one chip.

The plurality of electronic components are mounted on the first main surface 30a or the second main surface 30b of the mounting substrate 30. In this specification and the like, "being mounted" includes a state in which an electronic component is disposed on (mechanically connected to) the first main surface 30a or the second main surface 30b of the mounting substrate 30 and a state in which an electronic component is electrically connected to (an appropriate conductive part) of the mounting substrate 30. Furthermore, "A (for example, an electronic component) is mounted on the first main surface 30a of the mounting substrate 30" does not necessarily mean a state in which A is directly mounted on the first main surface 30a but also includes a state in which A is arranged in a space near the first main surface 30a, out of the space near the first main surface 30a and a space near the second main surface 30b that are isolated from each other by the mounting substrate 30. That is, this includes a state in which A is mounted on the first main surface 30a with another circuit element, an electrode, or the like interposed therebetween.

More particularly, an external terminal of an electronic component mounted on the first main surface 30a of the mounting substrate 30 is connected to a first pad 35 on the first main surface 30a of the mounting substrate 30. Depending on the electronic component, an external terminal of the electronic component is connected to the first pad 35 with a metal member 38 (for example, a solder bump) interposed therebetween. Furthermore, an external terminal of an electronic component mounted on the second main surface 30b of the mounting substrate 30 is connected to a second pad 36 on the second main surface 30b of the mounting substrate 30. Depending on the electronic component, an external terminal of the electronic component is connected to the second pad 36 with a metal member 38 interposed therebetween.

More particularly, the IC chip 19, the output matching circuit 13, the duplexer 9, the matching circuits 14 to 16, and the transmission/reception filter 8 are mounted on the first main surface 30a of the mounting substrate 30. In the example of FIG. 2, the IC chip 19, the output matching circuit 13, the duplexer 9, and the matching circuits 14 and 15 are arranged in this order from the left end side to the right end side of the second direction D2 on the first main surface 30a of the mounting substrate 30. Furthermore, the IC chip 19, the output matching circuit 13, the duplexer 9, and the matching circuits 14 and 15 are arranged in a first half region of the third direction D3 on the first main surface 30a of the mounting substrate 30. The matching circuit 16 is arranged behind the IC chip 19 on the first main surface 30a of the mounting substrate 30. The transmission/reception filter 8 is arranged behind the matching circuits 15 and 16 on the first main surface 30a of the mounting substrate 30.

Referring back to FIG. 4, the power amplifier 11, the second switch 5, the low noise amplifier 12, the duplexer 10, the first switch 4, and the plurality of external connection terminals 34 are mounted on the second main surface 30b of the mounting substrate 30. In the example of FIG. 3, the power amplifier 11, the second switch 5, the low noise amplifier 12, and the duplexer 10 are arranged in this order from the left end side to the right end side of the second direction D2 on the second main surface 30b of the mounting substrate 30. Furthermore, the power amplifier 11, the second switch 5, the low noise amplifier 12, and the duplexer 10 are arranged in a first half region of the third direction D3 on the second main surface 30b of the mounting substrate 30. The first switch 4 is arranged behind the low noise amplifier on the second main surface 30b of the mounting substrate 30.

As illustrated in FIG. 4, in this embodiment, the power amplifier 11 and at least part of each of the output matching circuit 13 and the IC chip 19 overlap in plan view from the thickness direction D1 of the mounting substrate 30. Thus, compared to the case where the output matching circuit 13 and the power amplifier 11 are arranged in such a manner that the output matching circuit 13 and the power amplifier 11 do not overlap in plan view from the thickness direction D1 of the mounting substrate 30, a wiring path between the output matching circuit 13 and the power amplifier 11 can be shortened. Similarly, compared to the case where the IC chip 19 and the power amplifier 11 are arranged in such a manner that the IC chip 19 and the power amplifier 11 do not overlap in plan view from the thickness direction D1 of the mounting substrate 30, a wiring path between the IC chip 19 and the power amplifier 11 can be shortened.

Figure 3:
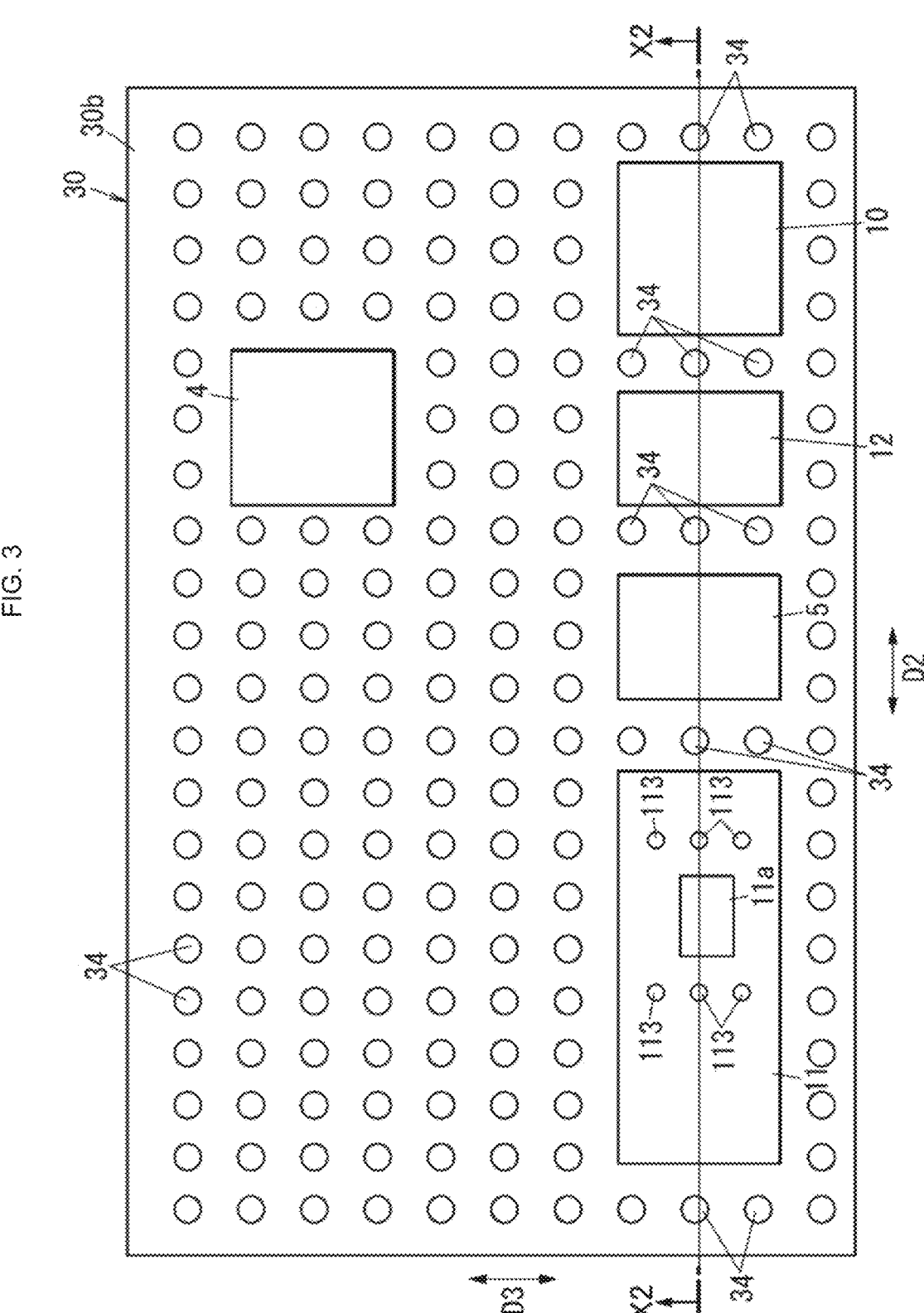
FIG. 3 is a plan view of a second main surface of the mounting substrate of the high frequency module seen through from the first main surface side.

As illustrated in FIG. 3, the plurality of external connection terminals 34 are arranged in a vacant region (that is, a region where no electronic component is arranged) of the second main surface 30b of the mounting substrate 30. The external connection terminals 34 each have, for example, a columnar shape (for example, a cylindrical shape) and are arranged so as to protrude downward from the second main surface 30b of the mounting substrate 30. Lower end surfaces of the external connection terminals 34 that are far away from the mounting substrate 30 are farther away from the mounting substrate 30 than lower surfaces (main surfaces far away from the mounting substrate 30) of electronic components mounted on the second main surface 30b of the mounting substrate 30 are.

As illustrated in FIG. 4, the resin layer 32A is provided on the first main surface 30a of the mounting substrate 30. The resin layer 32A covers the entire electronic components mounted on the first main surface 30a of the mounting substrate 30. The resin layer 32B is provided on the second main surface 30b of the mounting substrate 30. The resin layer 32B covers at least part of each of the plurality of electronic components mounted on the second main surface 30b of the mounting substrate 30 and at least part of each of the plurality of external connection terminals 34. More particularly, the resin layer 32B covers the entire electronic components mounted on the second main surface 30b of the mounting substrate 30. The resin layer 32B covers part of each of the plurality of external connection terminals 34 that is other than the lower end surface, which is exposed. The resin layers 32A and 32B include resin. However, the resin layers 32A and 32B also include filler as well as resin. Materials of the resin layers 32A and 32B may be the same or may be different.

The plurality of connecting members 17 are connected to an external substrate 40 (for example, a mother board). That is, the plurality of connecting members 17 are able to be connected to the external substrate 40. In this embodiment, the plurality of connecting members 17 are mounted on the external substrate 40 with solder 41 interposed therebetween. The plurality of connecting members 17 include connecting members 171 and connecting members 172. The connecting members 171 are provided so as to be in contact with the lower end surfaces of the external connection terminals 34 on the lower surface (a main surface far away from the mounting substrate 30) of the resin layer 32B. The connecting members 171 are connected to the external connection terminals 34. The connecting members 172 are provided so as to be in contact with lower surfaces of metal members 114, which will be described later, for the power amplifier 11 on the lower surface of the resin layer 32B. The connecting members 172 are connected to the metal members 114.

The shield layer 33 is formed of, for example, metal. The shield layer 33 is provided on an outer surface (an outer circumferential surface and a top surface) of the resin layer 32A, an outer circumferential surface of the resin layer 32B, and an outer circumferential surface of the mounting substrate 30. The shield layer 33 covers the entire outer surface of the resin layer 32A, the entire outer circumferential surface of the mounting substrate 30, and the entire outer circumferential surface of the resin layer 32B. The shield layer 33 is in contact with the ground layer of the mounting substrate 30. Thus, in the high frequency module 1, the potential of the shield layer 33 and the potential of the ground layer (ground potential) can be the same.

(2-5) Details of Configuration of Power Amplifier

As illustrated in FIG. 4, the power amplifier 11 includes a base material 111, a circuit part (, and through-vias 113. The high frequency module 1 also includes metal members 114 (second metal members) connected to lower end surfaces of the through-vias 113.

The base material 111 has, for example, a rectangular plate shape. The base material 111 is a member having insulation characteristics (for example, a gallium arsenide (GaAs) substrate or a multilayer substrate in which a gallium arsenide substrate and a silicon (Si) substrate are laminated). The base material 111 has a main surface 111a and a main surface 111b that are opposite to each other. The main surface 111a is a main surface of the base material 111 that is near the mounting substrate 30. The main surface 111b is a main surface of the base material 111 that is far away from the mounting substrate 30. The main surface 111a of the base material 111 is between the second main surface 30b of the mounting substrate 30 and the main surface 111b of the base material 111.

The circuit part is a part configuring a circuit of the power amplifier 11 and is arranged on the main surface 111a of the base material 111. The circuit part includes a plurality of transistors. A transistor 11a in the final stage out of the plurality of transistors is disposed on the main surface 111a of the base material 111. The transistor 11a in the final stage is the transistor used at a circuit in the output stage of the power amplifier 11. In other words, the transistor 11a in the final stage is the transistor included in the last processing stage (final stage) out of the plurality of stages of the power amplifier 11.

Heat generated at the power amplifier 11 (for example, the transistor 11a) is transmitted through the through-vias 113 from the main surface 111a side to the main surface 111b side of the power amplifier 11. The through-vias 113 penetrate through the base material 111 in the thickness direction (thickness direction D1). That is, the through-vias 113 penetrate through between the main surface 111a and the main surface 111b of the base material 111. The through-vias 113 are each formed of a member having thermal conductivity (for example, silicone). The through-vias 113 each have, for example, a columnar shape (for example, a cylindrical shape). An upper end surface (end surface near the main surface 111a) of each of the through-vias 113 is connected to a second pad 36 on the mounting substrate 30 with a metal member 38 interposed therebetween. A lower end surface (end surface near the main surface 111b) of each of the through-vias 113 is connected to a connecting member 172 (17) with a metal member 114 interposed therebetween. The through-vias 113 are disposed around the transistor 11a in the final stage. In the example of FIG. 4, the through-vias 113 are disposed on both sides of the transistor 11a in the second direction D2. More particularly, on both sides of the transistor 11a in the second direction D2, the plurality of through-vias 113 are arranged along the third direction D3. The third direction D3 is a direction that intersects (for example, orthogonal to) the second direction D2.

In this embodiment, the power amplifier 11 is mounted on the second main surface 30b of the mounting substrate 30 with the plurality of metal members 38 (first metal members) interposed therebetween. The upper end surface (end surface near the main surface 111a) of each of the through-vias 113 is connected to one of the plurality of metal members 38. More particularly, the through-via 113 is connected to a metal member 38 closest to the transistor 11a among the plurality of metal members 38, in plan view from the thickness direction D1 of the mounting substrate 30. Alternatively, the through-via 113 is connected to a metal member 38 next to the transistor 11a in plan view from the thickness direction D1 of the mounting substrate 30. A "metal member 38 next to the transistor 11a" is a metal member 38 that is arranged next to the transistor 11a with no metal member 38 interposed therebetween.

The metal members 114 are members that electrically connect the lower end surfaces (end surfaces near the main surface 111b) of the through-vias 113 to the connecting members 17 (172) on the lower surface of the resin layer 32B. The metal members 114 are disposed between the power amplifier 11 and the connecting members 172 and are connected to the connecting members 172. The metal members 114 each have, for example, a cylindrical shape. The metal members 114 are arranged in contact with the through-vias 113 on the main surface 111b of the base material 111. That is, the metal members 114 and the through-vias 113 overlap in plan view from the thickness direction D1 of the mounting substrate 30. The metal members 114 are covered with the resin layer 32B in such a manner that lower surfaces (main surfaces far away from the mounting substrate 30) of the metal members 114 are exposed. The metal members 114 are connected to the connecting members 172 disposed on the lower surfaces (main surfaces far away from the mounting substrate 30) of the resin layer 32B.

(2-6) Arrangement of External Connection Terminals

As illustrated in FIGS. 3 and 4, in this embodiment, the external connection terminals 34 are disposed between the power amplifier 11 and the second switch 5 on the second main surface 30b of the mounting substrate 30, and the external connection terminals 34 are connected to the connecting members 17 (171). That is, the plurality of external connection terminals 34 include external connection terminals 34 (first external connection terminals) that are connected to the connecting members 17, and these external connection terminals 34 (first external connection terminals) are disposed between the power amplifier 11 and the second switch 5 on the second main surface 30b of the mounting substrate 30.

In this embodiment, "an external connection terminal 34 is disposed between two electronic components A and B" means that at least part of the external connection terminal 34 is arranged in a region of the set of line segments connecting an arbitrary point in a region of the electronic component A to an arbitrary point in a region of the electronic component B in plan view from the thickness direction D1 of the mounting substrate 30. Based on this, for example, "an external connection terminal 34 is disposed between the power amplifier 11 and the second switch 5" means that at least part of the external connection terminal 34 is arranged in a region of the set of line segments connecting an arbitrary point in a region of the power amplifier 11 to an arbitrary point in a region of the second switch 5 in plan view from the thickness direction D1 of the mounting substrate 30.

The second switch 5 is disposed next to the power amplifier 11. "The second switch 5 is disposed next to the power amplifier 11" means that no electronic component is disposed between the second switch 5 and the power amplifier 11. Among the plurality of electronic components mounted on the second main surface 30b of the mounting substrate 30, the second switch 5 is disposed closest to the power amplifier 11 in plan view from the thickness direction D1 of the mounting substrate 30.

(2-7) Example of Transmission (Flow) of Heat Generated at Power Amplifier

Figure 5:
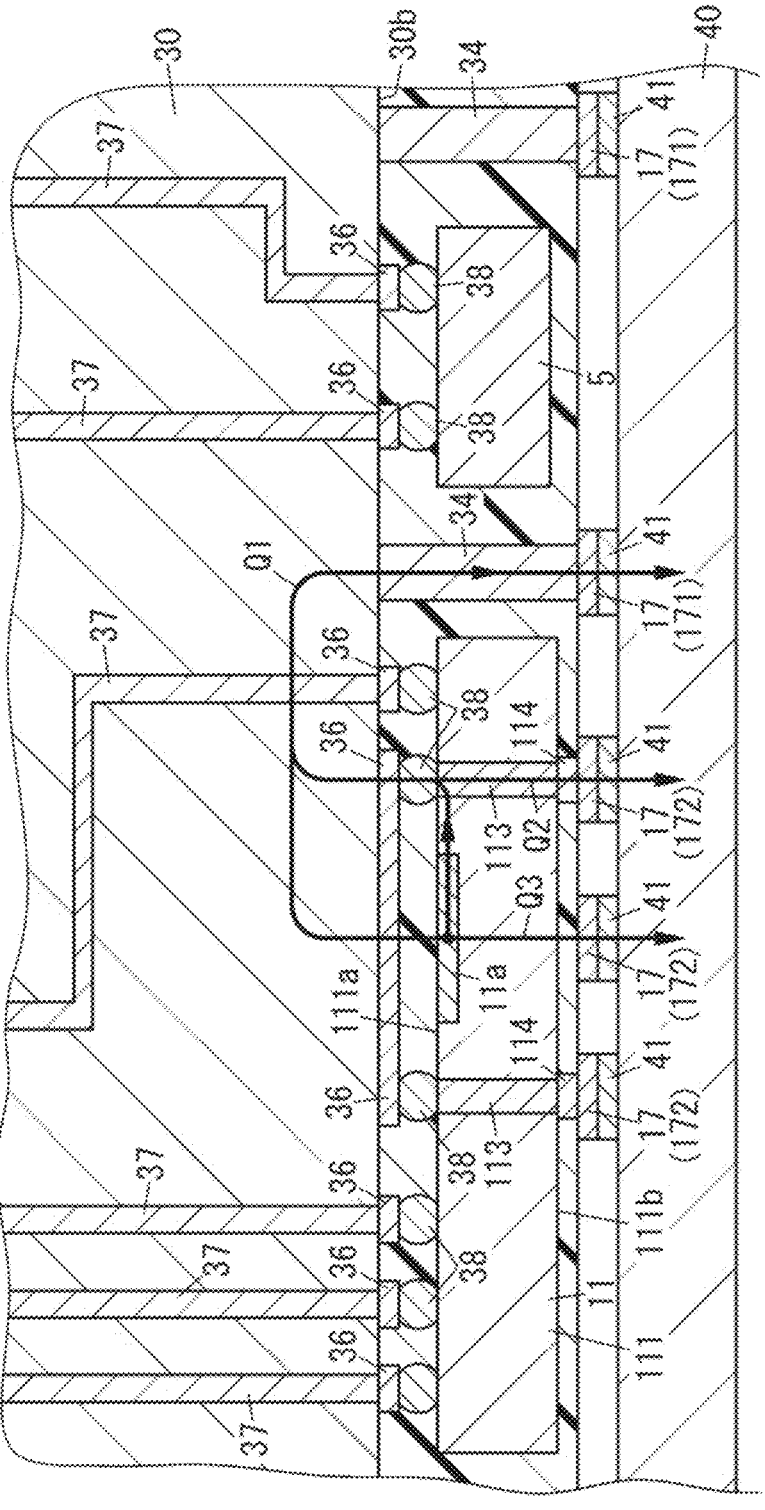
FIG. 5 is an explanatory diagram explaining the flow of heat generated at a power amplifier in the high frequency module.

As illustrated in FIG. 5, the power amplifier 11 is mounted on the second main surface 30b of the mounting substrate 30. Thus, part Q3 of heat (hereinafter, described as heat Q3) generated at the power amplifier 11 is transmitted from the main surface 111b of the power amplifier 11, for example, through the resin layer 32B and the connecting members 172, to the external substrate 40, and is thus dissipated. This heat dissipation path is shorter than a heat dissipation path through which heat of the power amplifier 11 is transmitted to the external substrate 40 in the case where the power amplifier 11 is mounted on the first main surface 30a of the mounting substrate 30. Thus, heat dissipation characteristics of the power amplifier 11 are improved compared to the case where the power amplifier 11 is mounted on the first main surface 30a of the mounting substrate 30.

Furthermore, as illustrated in FIG. 5, an external connection terminal 34 connected to a connecting member 171 is disposed between the power amplifier 11 and the second switch 5. Thus, part Q1 of heat (hereinafter, described as heat Q1) generated at the power amplifier 11 (for example, the transistor 11a) is transmitted to the mounting substrate 30 through the resin layer 32B or a metal member 38 (for example, the metal member 38 closest to the transistor 11a)

between the power amplifier 11 and the mounting substrate 30. Then, the heat Q1 transmitted to the mounting substrate 30 is diffused in a direction parallel to the second main surface 30b at the mounting substrate 30. Then, part of the diffused heat Q1 is transmitted, through the external connection terminal 34 and the connecting member 171 in order that are arranged between the power amplifier 11 and the second switch 5, to the external substrate 40 connected to the connecting member 17, and is thus dissipated. Accordingly, transmission of the heat Q1 generated at the power amplifier 11 to the second switch 5 can be suppressed. As a result, influence of the heat Q1 generated at the power amplifier 11 on the second switch 5 can be suppressed.

More particularly, as illustrated in FIG. 3, the plurality of external connection terminals 34 are disposed between the power amplifier 11 and the second switch 5. The plurality of external connection terminals 34 are arranged in a direction (third direction D3) that intersects (for example, orthogonal to) a direction (second direction D2) in which the power amplifier 11 and the second switch 5 are arranged, in plan view from the thickness direction D1 of the mounting substrate 30. Thus, due to the plurality of external connection terminals 34 between the power amplifier 11 and the second switch 5, influence of the heat Q1 generated at the power amplifier 11 on the second switch 5 can further be suppressed.

Furthermore, due to the external connection terminals 34 between the power amplifier 11 and the second switch 5, influence of the heat Q1 generated at the power amplifier 11 on other electronic components (for example, the low noise amplifier 12 and the duplexer 10) mounted on the second main surface 30b of the mounting substrate 30 can also be suppressed.

Similarly, the plurality of external connection terminals 34 connected to the connecting members 171 are also disposed between the second switch 5 and the low noise amplifier 12. Due to the plurality of external connection terminals 34, influence of the heat Q1 generated at the power amplifier 11 on the low noise amplifier 12 can also be suppressed, as with the plurality of external connection terminals 34 disposed between the power amplifier 11 and the second switch 5. Similarly, the plurality of external connection terminals 34 connected to the connecting members 171 are also disposed between the low noise amplifier 12 and the duplexer 10. Due to the plurality of external connection terminals 34, influence of the heat Q1 generated at the power amplifier 11 on the duplexer 10 can also be suppressed. Similarly, the plurality of external connection terminals 34 connected to the connecting members 171 are also disposed between the power amplifier 11 and the first switch 4. Due to the plurality of external connection terminals 34, influence of the heat Q1 generated at the power amplifier 11 on the first switch 4 can also be suppressed.

Furthermore, part (Q2) of heat (hereinafter, described as heat Q2) generated at the power amplifier 11 is transmitted, through the power amplifier 11, and then a through-via 113, a metal member 114, and a connecting members 172 (17) in order, to the external substrate 40, and is thus dissipated. Accordingly, the flow rate of the heat Q1 transmitted from the power amplifier 11 to the mounting substrate 30 can be reduced. As a result, influence of the heat Q1 generated at the power amplifier 11 on the second switch 5 can further be suppressed. Furthermore, since the heat Q2 of the power amplifier 11 is dissipated to the external substrate 40 through the connecting member 172 (that is, without bypassing the external connection terminal 34), the heat dissipation characteristics of the power amplifier 11 are improved.

(3) Main Effects

The high frequency module 1 according to this embodiment includes the mounting substrate 30, the power amplifier 11, the first electronic component (for example, the second switch 5), the external connection terminals 34, and the connecting members 17. The mounting substrate 30 has the first main surface 30a and the second main surface 30b that are opposite to each other. The power amplifier 11 and the first electronic component are disposed on the second main surface 30b of the mounting substrate 30. The plurality of external connection terminals 34 are disposed on the second main surface 30b of the mounting substrate 30. The connecting members 17 are able to be connected to the external substrate 40. The plurality of external connection terminals 34 include an external connection terminal 34 (first external connection terminal) connected to the connecting member 171. The external connection terminal 34 (first external connection terminal) is disposed between the power amplifier 11 and the first electronic component on the second main surface 30b of the mounting substrate 30.

With this arrangement, the power amplifier 11 is disposed on the second main surface 30b (that is, a main surface near the connecting members 17) of the mounting substrate 30. Thus, compared to the case where the power amplifier 11 is disposed on the first main surface 30a of the mounting substrate 30, the distance between the external substrate 40 connected to the connecting members 17 and the power amplifier 11 (that is, a heat dissipation path) can be shortened. Therefore, heat generated at the power amplifier 11 can be dissipated to the external substrate 40 efficiently (for example, at a lower thermal resistance). As a result, heat dissipation characteristics of the power amplifier 11 can be improved.

Furthermore, the external connection terminal 34 connected to the connecting member 171 is disposed between the power amplifier 11 and the first electronic component (for example, the second switch 5) on the second main surface 30b of the mounting substrate 30. Thus, the heat Q1 transmitted from the power amplifier 11 to the mounting substrate 30 can be dissipated efficiently to the outside through the external connection terminal 34 and the connecting member 171. Furthermore, in the state in which the external substrate 40 is connected to the connecting member 171, the heat Q1 of the power amplifier 11 can be dissipated efficiently to the external substrate 40 through the external connection terminal 34 and the connecting member 171. As a result, influence of the heat Q1 generated at the power amplifier on the first electronic component (for example, the second switch 5) can be suppressed.

As described above, the heat dissipation characteristics of the power amplifier 11 can be improved, and influence of heat generated at the power amplifier 11 on another electronic component (first electronic component) can be suppressed.

(4) Modifications

Modifications of the embodiment described above will be described. In the description provided below, the same component elements as those in the embodiment described above will be assigned the same signs as those provided to the component elements in the embodiment described above, and explanation of those same component elements will be omitted. Component elements different from those in the embodiment described above will be mainly described. The modifications that will be described below may be combined together.

(4-1) Modification 1

Figure 6:
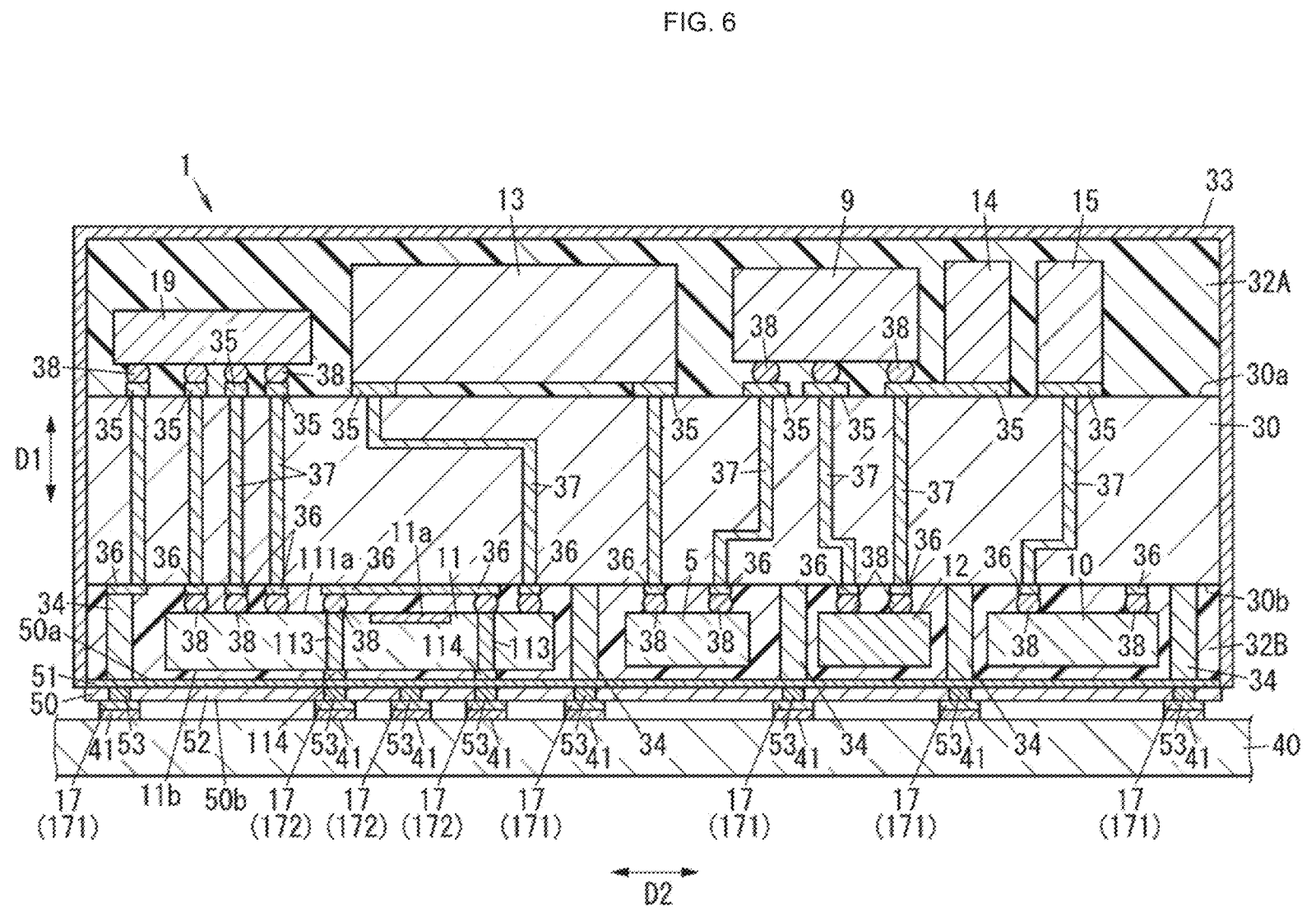

As illustrated in FIG. 6, the high frequency module 1 according to Modification 1 further includes a redistribution layer 50 (wiring layer) in addition to the configurations in the embodiment described above.

The redistribution layer 50 is provided between the rear surface (main surface far away from the mounting substrate 30) of the resin layer 32B and the connecting members 17. The redistribution layer 50 has a third main surface 50a (third main surface) and a fourth main surface 50b (fourth main surface) that are opposite to each other on both sides of the redistribution layer 50 in the thickness direction (thickness direction D1). The third main surface 50a is a main surface of the redistribution layer 50 that is near the mounting substrate 30. The fourth main surface 50b is a main surface of the redistribution layer 50 that is far away from the mounting substrate 30. The plurality of external connection terminals 34 are disposed between the second main surface 30b (second main surface) of the mounting substrate 30 and the third main surface 50a (third main surface) of the redistribution layer 50. That is, the third main surface 50a of the redistribution layer 50 is between the second main surface 30b of the mounting substrate 30 and the fourth main surface 50b of the redistribution layer 50. Furthermore, the third main surface 50a of the redistribution layer 50 is arranged between the lower surface (main surface far away from the mounting substrate 30) of the power amplifier 11 and the fourth main surface 50b of the redistribution layer 50. The plurality of connecting members 17 are disposed on the fourth main surface 50b of the redistribution layer 50.

The redistribution layer 50 includes a conductive layer 51, a substrate 52, and vias 53.

The conductive layer 51 is a layer configuring an electroconductive path (wire). The conductive layer 51 is arranged to have a predetermined pattern on the rear surface of the resin layer 32B. The conductive layer 51 is in contact with the lower end surfaces (end surfaces far away from the mounting substrate 30) of the plurality of external connection terminals 34 and the lower end surfaces (end surfaces far away from the mounting substrate 30) of the metal members 114.

The substrate 52 is formed of an insulating member (for example, a dielectric). The substrate 52 has a flat plate shape and is thinner than the mounting substrate 30. The substrate 52 is provided on the rear surface of the resin layer 32B so as to cover the entire rear surface of the resin layer 32B. The main surfaces of the substrate 52 on both sides of the thickness direction D1 configure the third main surfaces 50a and 50b on both sides of the redistribution layer 50. The conductive layer 51 is provided between the resin layer 32B and the substrate 52.

The vias 53 are, for example, conductive members each having a columnar shape (for example, a cylindrical shape) and are provided at the substrate 52 so as to penetrate in the thickness direction (thickness direction D1) of the substrate 52. The vias 53 are in contact with the conductive layer 51 and the connecting members 17 on the rear surface (main surface near the mounting substrate 30) of the substrate 52. The vias 53 are connected to the external connection terminals 34 or the metal members 114 with the conductive layer 51 interposed therebetween. The plurality of connecting members 17 are disposed on the rear surface of the substrate 52 (that is, the fourth main surface 50b of the redistribution layer 50). The plurality of connecting members 17 are mounted on the external substrate 40 by the solder 41, as in the embodiment described above.

In the redistribution layer 50, by adjusting the shape of the pattern of the conductive layer 51 and arrangement of the vias 53, each of the plurality of connecting members 17 may be arranged in such a manner that the connecting member 17 and the external connection terminal 34 or the metal member 114 connected to the connecting member 17 overlap in plan view in the thickness direction (thickness direction D1) of the substrate 52 or in such a manner that the connecting member 17 and the external connection terminal 34 or the metal members 114 do not overlap. As described above, with the provision of the redistribution layer 50, the flexibility of arrangement of the plurality of connecting members 17 on the fourth main surface 50b of the redistribution layer 50 can be improved.

(4-2) Modification 2

As illustrated in FIG. 4, in the embodiment described above, an external connection terminal 34 is disposed between electronic components that are arranged next to each other, among the plurality of electronic components (the power amplifier 11, the second switch 5, the low noise amplifier 12, and the duplexer 10) mounted on the second main surface 30b of the mounting substrate 30.

In Modification 2, the external connection terminals 34 arranged between the power amplifier 11 and the second switch 5 are connected to the ground. More particularly, the external connection terminals 34 arranged between the power amplifier 11 and the second switch 5 are connected to the ground layer of the external substrate 40 with the connecting members 17 and the external substrate 40 interposed therebetween. Accordingly, the external connection terminals 34 arranged between the power amplifier 11 and the second switch 5 function as electromagnetic shielding members. As a result, with the external connection terminals 34, isolation between the power amplifier 11 and the second switch 5 can be ensured.

Similarly, the external connection terminals 34 arranged between the second switch 5 and the low noise amplifier 12 may also be connected to the ground. Furthermore, the external connection terminals 34 arranged between the low noise amplifier 12 and the duplexer 10 may also be connected to the ground.

(4-3) Modification 3

As illustrated in FIG. 4, in the embodiment described above, the external connection terminals 34 are disposed on, for example, both sides of each of the plurality of electronic components (the power amplifier 11, the second switch 5, the low noise amplifier 12, and the duplexer 10) in the second direction D2 mounted on the second main surface 30b of the mounting substrate 30 in plan view from the thickness direction D1 of the mounting substrate 30.

In Modification 3, the external connection terminals 34 (second external connection terminals) on both sides of the power amplifier 11 in the second direction D2 are connected to the ground. More particularly, the external connection terminals 34 on both sides of the power amplifier 11 in the second direction D2 are connected to the ground layer of the external substrate 40 with the connecting members 171 and the external substrate 40 interposed therebetween. Thus, isolation can be ensured on both sides of the power amplifier 11 in the second direction D2. That is, propagation of noise generated from the power amplifier 11 to both sides of the power amplifier 11 in the second direction D2 can be suppressed. Furthermore, external noise entering the power amplifier 11 from both sides of the power amplifier 11 in the second direction D2 can be suppressed.

In Modification 3, the external connection terminals 34 on both sides of the power amplifier 11 in the second direction D2 are connected to the ground. However, instead of connecting the external connection terminals 34 on both sides of the power amplifier 11 in the second direction D2 to the ground, the external connection terminals 34 (second external connection terminals) on both sides of the power amplifier 11 in the third direction D3 may be connected to the ground. Furthermore, both the external connection terminals 34 on both sides of the power amplifier 11 in the second direction D2 and the external connection terminals 34 on both sides of the power amplifier 11 in the third direction D3 may be connected to the ground.

Similarly, the external connection terminals 34 (second external connection terminals) on both sides of the second switch 5 in the second direction D2 may be connected to the ground. Furthermore, the external connection terminals 34 (second external connection terminals) on both sides of the second switch 5 in the third direction D3 may be connected to the ground. Similarly, the external connection terminals 34 on both sides of each of the low noise amplifier 12 and the duplexer 10 in the second direction D2 may be connected to the ground. Furthermore, the external connection terminals 34 on both sides of each of the low noise amplifier 12 and the duplexer 10 in the third direction D3 may be connected to the ground.

(4-4) Modification 4

In the embodiment described above, the external connection terminals 34 (first external connection terminals) may be disposed between a reception-system electronic component (first electronic component) and the power amplifier 11 that are disposed on the second main surface 30b of the mounting substrate 30. In this case, the external connection terminals 34 disposed between the reception-system electronic component and the power amplifier 11 are connected to the ground, as in Modification 2. The reception-system electronic component (first electronic component) is an electronic component connected to a reception path through which a reception signal received at the antenna 3 passes. The reception path is a signal path connecting the antenna terminal 34A to the signal output terminal 34D. For example, in the circuit illustrated in FIG. 1, reception-system electronic components include the low noise amplifier 12, the duplexers 9 and 10, the transmission/reception filter 8, and the like. The power amplifier 11 is a transmission-system electronic component. The transmission-system electronic component is an electronic component connected to a transmission path through which a transmission signal passes. The transmission path is a signal path connecting the antenna terminal 34A to the signal input terminals 34B and 34C. According to Modification 4, isolation between the transmission-system electronic component (power amplifier 11) and the reception-system electronic component (first electronic component) can be ensured.

(4-5) Modification 5

Figure 7:
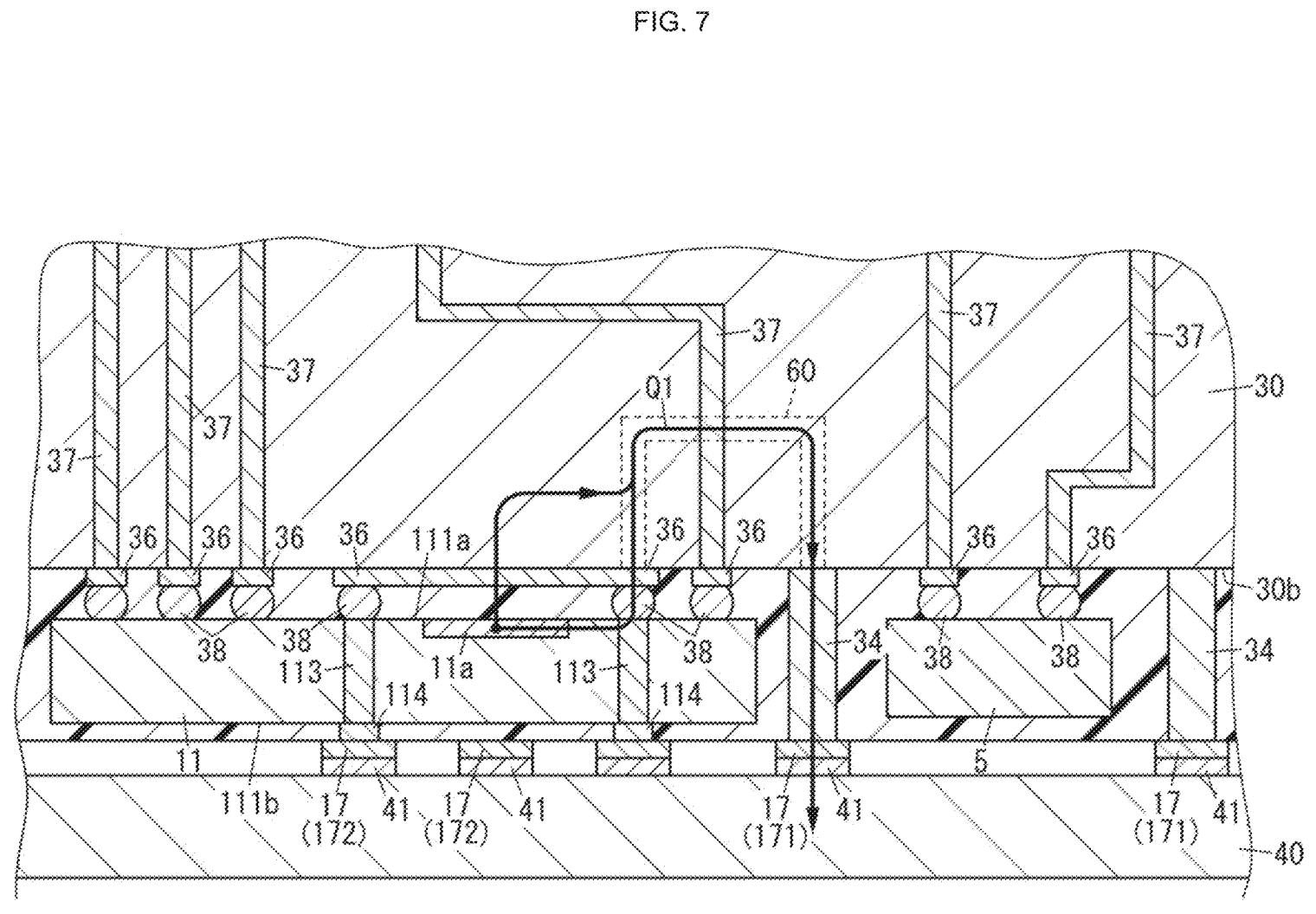

As illustrated in FIG. 7, the high frequency module 1 according to Modification 5 further includes a conductive path 60, in addition to the configurations in the embodiment described above.

The conductive path 60 is a member that allows connection between a metal member 38 and an external connection terminal 34 at the mounting substrate 30. The conductive path 60 is formed of a member (for example, copper or copper alloy) whose thermal conductivity is higher than that of the mounting substrate 30. With the conductive path 60, heat can be transmitted efficiently from the metal member 38 to the external connection terminal 34 at the mounting substrate 30. In FIG. 7, the conductive path 60 is provided inside the mounting substrate 30. However, the conductive path 60 may be provided on the second main surface 30*b* of the mounting substrate 30.

The metal member 38 (for example, a solder bump) is a member connecting the power amplifier 11 to a second pad 36 on the second main surface 30*b* of the mounting substrate 30. In Modification 5, the conductive path 60 is connected to the metal member 38 with the second pad 36 interposed therebetween. Furthermore, the metal member 38 is connected to the through-via 113 of the power amplifier 11. For example, among the plurality of metal members 38 for connecting the power amplifier 11 to the second pads 36, the metal member 38 mentioned above is a metal member closest to the transistor 11*a* or a metal member next to the transistor 11*a* in plan view from the thickness direction D1 of the mounting substrate 30. The external connection terminal 34 mentioned above is disposed between the power amplifier 11 and the first electronic component (for example, the second switch 5).

In Modification 5, part Q1 of heat (hereinafter, described as heat Q1) generated at the power amplifier 11 (for example, the transistor 11*a*) is transmitted to the mounting substrate 30 through the metal member 38 closest to the transistor 11*a* or through the upper surface of the power amplifier 11 and then the resin layer 32B. The heat Q1 transmitted to the mounting substrate 30 is transmitted, through the conductive path 60, to the external connection terminal 34 disposed between the power amplifier 11 and the second switch 5. Then, the heat Q1 transmitted to the external connection terminal 34 is dissipated, through the external connection terminal 34 and the connecting member 17, to the external substrate 40. As described above, the heat Q1 transmitted from the power amplifier 11 to the mounting substrate 30 is efficiently transmitted through the conductive path 60 to the external connection terminal 34. Thus, the heat Q1 transmitted from the power amplifier 11 to the mounting substrate 30 can be quickly dissipated, through the external connection terminal 34, to the external substrate 40.

(4-6) Modification 6

Figure 8:
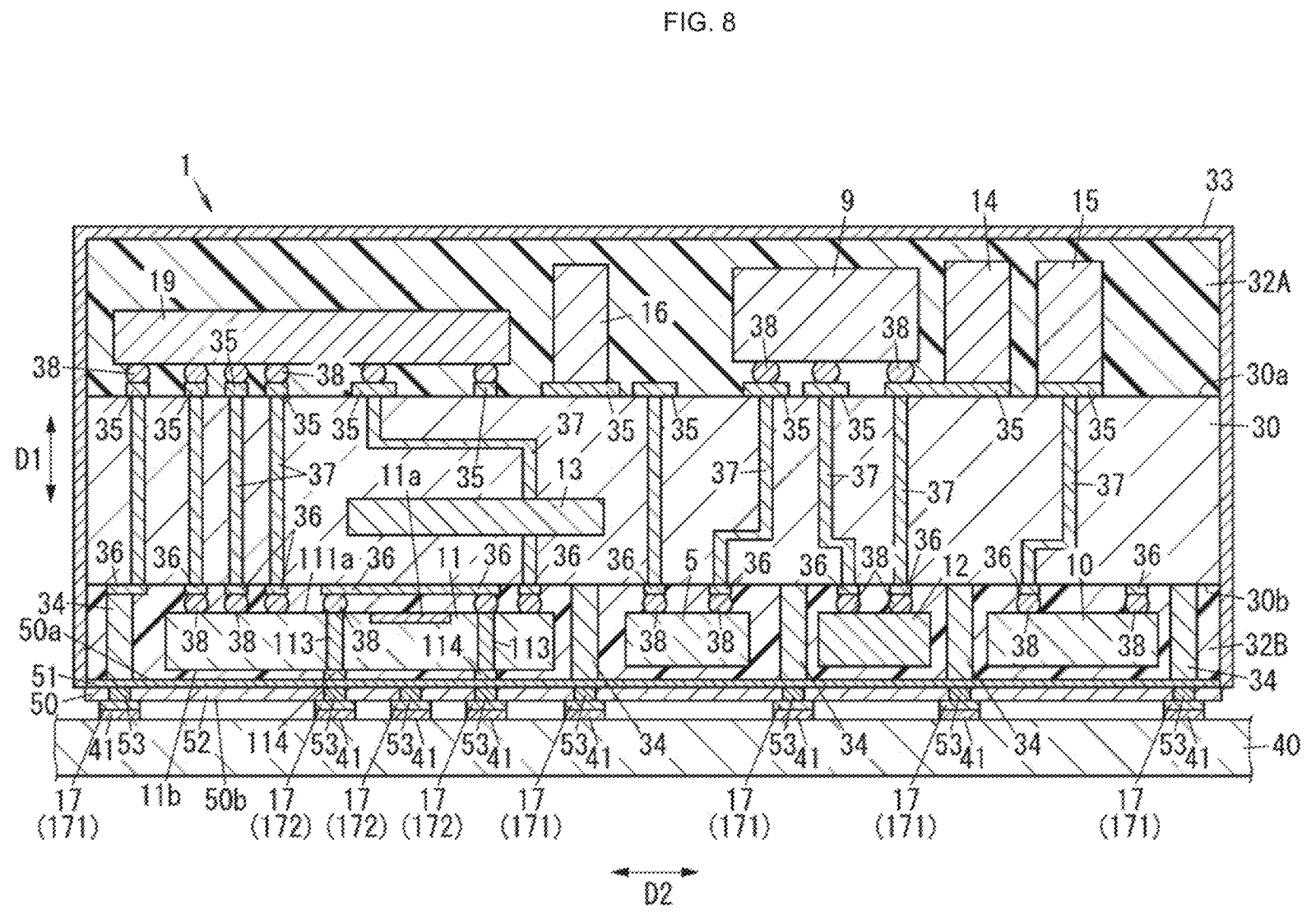

In Modification 1, as illustrated in FIG. 6, the output matching circuit 13 connected to the output part of the power amplifier 11 is disposed on the first main surface 30*a* of the mounting substrate 30. In contrast, in Modification 6, as illustrated in FIG. 8, the output matching circuit 13 connected to the output part of the power amplifier 11 is disposed inside the mounting substrate 30. More particularly, in Modification 6, the output matching circuit 13 and the power amplifier 11 overlap in plan view from the thickness direction D1 of the mounting substrate 30. "A (for example, the output matching circuit 13) and B (power amplifier 11) overlap in plan view from the thickness direction D1 of the mounting substrate 30" means that at least part of A and at least part of B overlap in plan view from the thickness direction D1 of the mounting substrate 30. Furthermore, it is desirable that the output matching circuit 13 be disposed closer to the second main surface 30*b* than to the first main surface 30*a* inside the mounting substrate 30. "A (for example, the output matching circuit 13) is disposed closer to the second main surface 30*b* than to the first main surface 30*a* inside the mounting substrate 30" means that "the center of A in the thickness direction D1 is closer to the second main surface 30*b* than to the center of the mounting substrate 30 in the thickness direction D1".

According to Modification 6, compared to the case where the output matching circuit 13 is disposed on the first main surface 30*a* of the mounting substrate 30 (FIG. 6), a wiring path between the power amplifier 11 and the output matching circuit 13 can be shortened. Thus, loss of a transmission signal at the wiring path between the power amplifier 11 and the output matching circuit 13 can be reduced. Furthermore, leakage of a transmission signal to the reception circuit side from the wiring path between the power amplifier 11 and the output matching circuit 13 can be reduced.

(4-7) Modification 7

Figure 9:
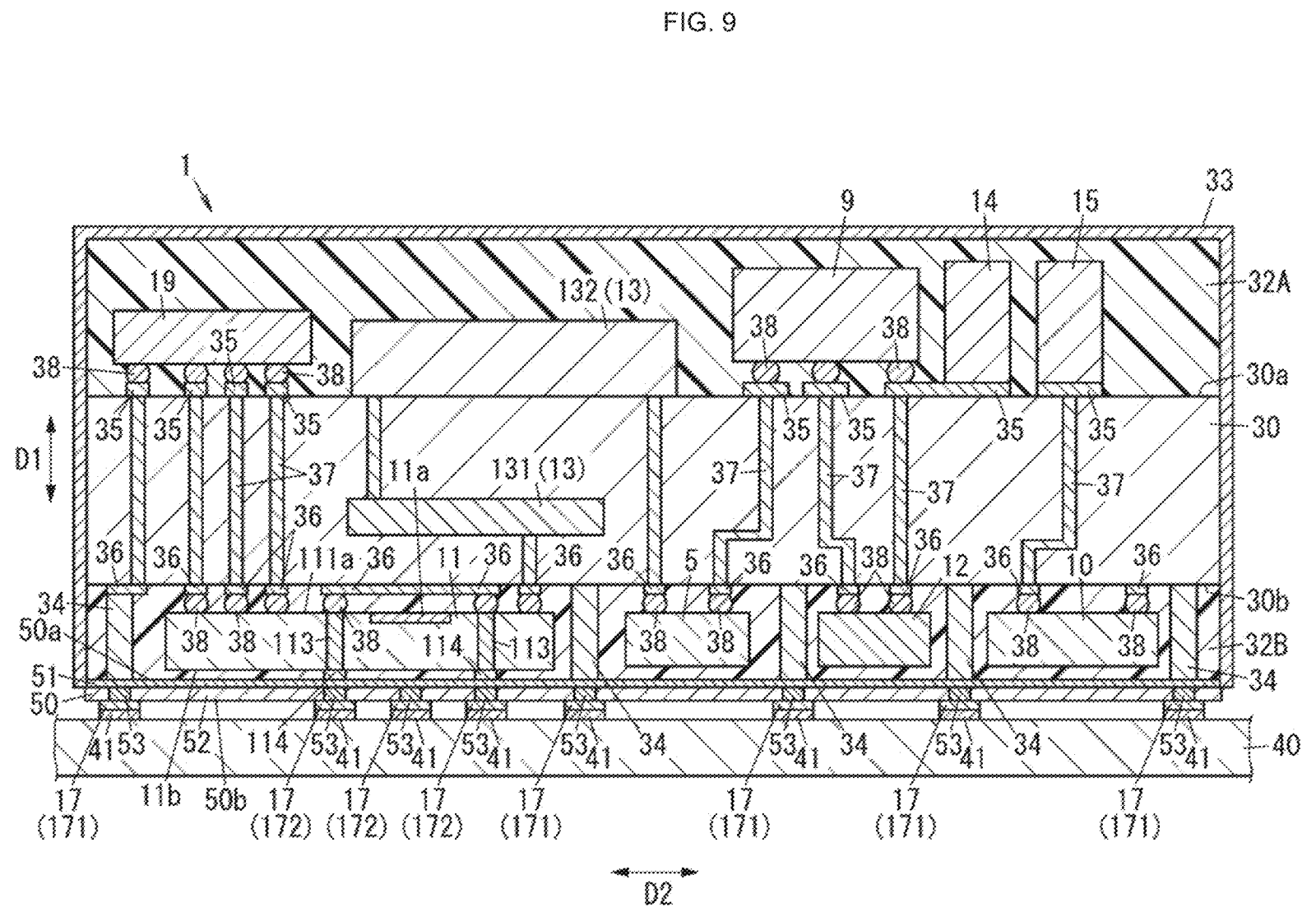

As illustrated in FIG. 9, Modification 7 is different from Modification 1 in that the output matching circuit 13 includes a transformer 131 and the transformer 131 is disposed inside the mounting substrate 30. More particularly, the output matching circuit 13 in Modification 7 includes the transformer 131 and other electrostatic circuits (for example, an inductor 132, a capacitor, a resistor, and the like). In Modification 7, the output matching circuit 13 includes the transformer 131 and the other electronic components. However, the output matching circuit 13 may include only the transformer 13.

The transformer 131 is connected between the output part of the power amplifier 11 and the common terminal 5*a* of the second switch 5. That is, the transformer 131 is connected to the output part of the power amplifier 11. The other electronic components mentioned above are connected between the transformer 131 and the common terminal 5*a*.

The transformer 131 is disposed inside the mounting substrate 30, and the transformer 131 and the power amplifier 11 overlap in plan view from the thickness direction D1 of the mounting substrate 30. "A (for example, the transformer 11) and B (power amplifier 11) overlap in plan view from the thickness direction D1 of the mounting substrate 30" is as defined above in Modification 6. Furthermore, it is desirable that the transformer 131 be disposed closer to the second main surface 30*b* than to the first main surface 30*a* inside the mounting substrate 30. "A (for example, the transformer 131) is disposed closer to the second main surface 30*b* than to the first main surface 30*a* inside the mounting substrate 30" is as defined above in Modification 6. The other electronic components mentioned above are, for example, disposed on the first main surface of the mounting substrate 30.

According to Modification 7, compared to the case where the transformer 131 is disposed on the first main surface 30*a* of the mounting substrate 30, a wiring path between the power amplifier 11 and the transformer 131 can be shortened. Thus, loss of a transmission signal at the wiring path between the power amplifier 11 and the transformer 131 can be reduced. Furthermore, leakage of a transmission signal to the reception circuit side from the wiring path between the power amplifier 11 and the transformer 131 can be reduced.

(4-8) Modification 8

Figure 10:
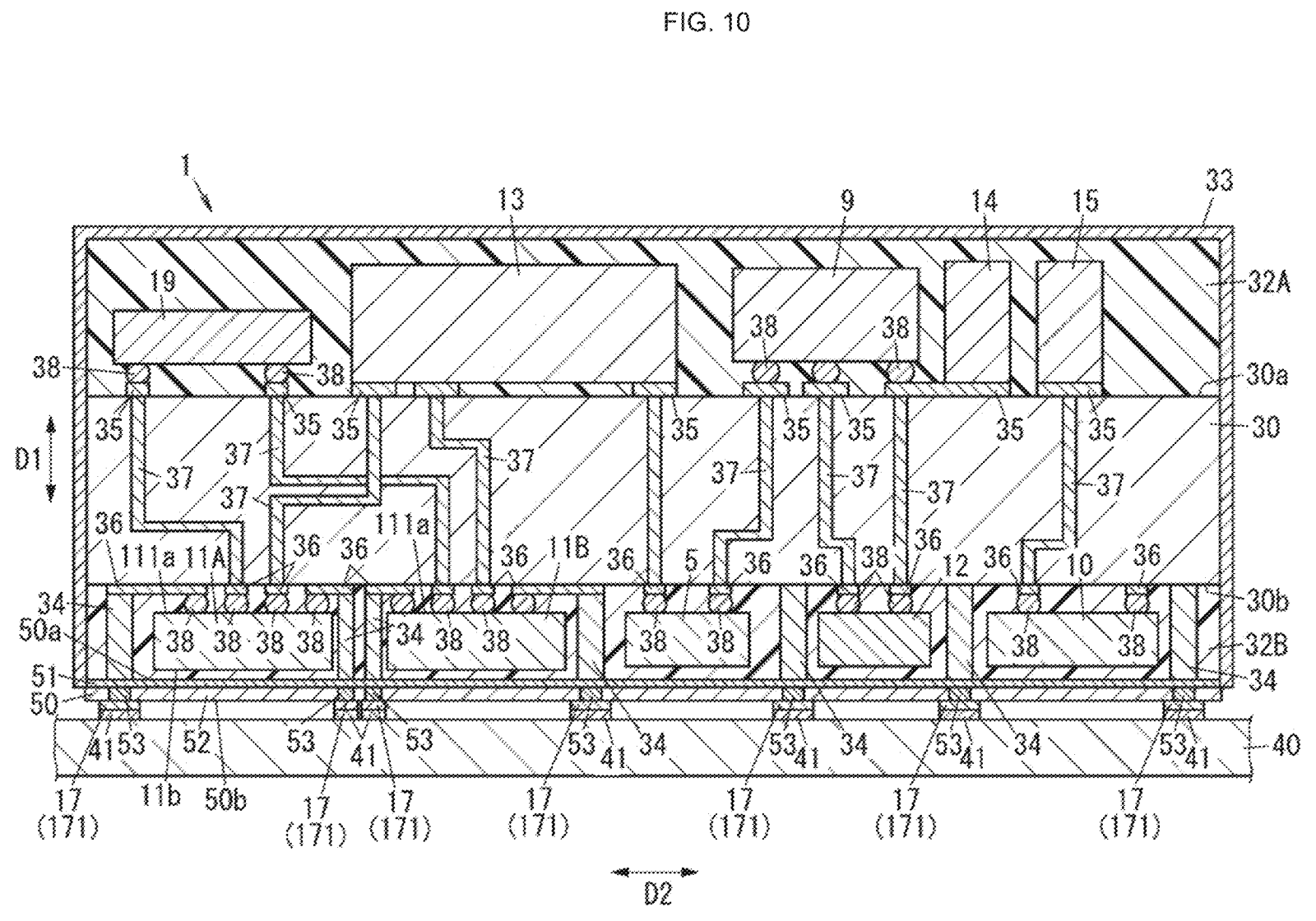

In Modification 1, as illustrated in FIG. 6, the case where a single power amplifier 11 is provided is illustrated. In Modification 8, as illustrated in FIG. 10, the case where a plurality of (in the example of FIG. 10, two) power amplifiers 11A and 11B are provided will be illustrated. In the example of FIG. 10, the plurality of power amplifiers 11A and 11B are configured to be capable of being selected by the third switch 6. The plurality of power amplifiers 11A and 11B are disposed on the second main surface 30*b* of the mounting substrate 30. The plurality of external connection terminals 34 (second external connection terminals) are disposed around each of the plurality of power amplifiers 11A and 11B. Among the plurality of external connection terminals 34, an external connection terminal 34A is an external connection terminal 34 disposed near the power amplifier 11A. Among the plurality of external connection terminals 34, an external connection terminal 34B is an external connection terminal 34 disposed near the power amplifier 11B.

The upper end surface (end surface near the mounting substrate 30) of the external connection terminal 34A is electrically connected to an external terminal of the power amplifier 11A with a second pad 36 and a metal member 38 (first metal member) interposed therebetween. The upper end surface (end surface near the mounting substrate 30) of the external connection terminal 34B is electrically connected to an external terminal of the power amplifier 11B with a second pad 36 and a metal member 38 (first metal member) interposed therebetween. The lower end surfaces (end surfaces far away from the mounting substrate 30) of the external connection terminals 34A and 34B are connected to the connecting members 171 with the conductive layer 51 and the vias 53 of the redistribution layer 50 interposed therebetween. The connecting members 171 are, for example, connected to the external substrate 40 (for example, the ground electrode of the external substrate 40) with the solder 41 interposed therebetween.

Figure 11:
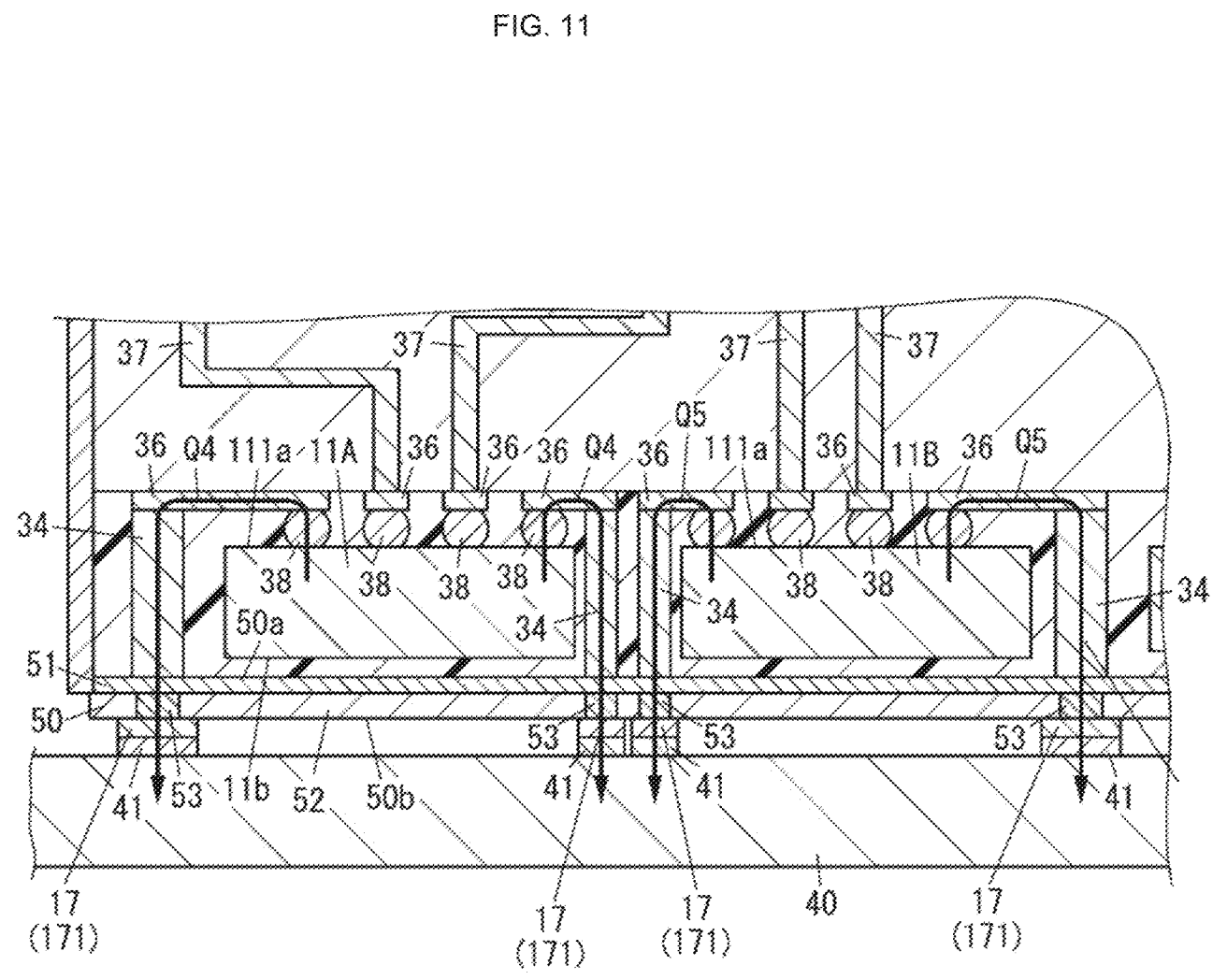

As illustrated in FIG. 11, heat Q4 generated at the power amplifier 11A is transmitted, through a main surface 111*a* (main surface near the mounting substrate 30) of the power amplifier 11A, and then a metal member 38, a second pad 36, an external connection terminal 34A, the conductive layer 51, a via 53, and a connecting member 171, to the external substrate 40, and is thus dissipated. Furthermore, heat Q5 generated at the power amplifier 11B is transmitted, through a main surface 111*a* (main surface near the mounting substrate 30) of the power amplifier 11B, and then a metal member 38, a second pad 36, an external connection terminal 34B, the conductive layer 51, a via 53, and a connecting member 171, to the external substrate 40, and is thus dissipated.

As described above, a heat dissipation path for the power amplifier 11A includes the external connection terminal 34A near the power amplifier 11A and other components and a heat dissipation path for the power amplifier 11B includes the external connection terminal 34B near the power amplifier 11B and other components. That is, the heat dissipation paths for the power amplifiers 11A and 11B are isolated from each other. Thus, a situation in which one of the power amplifiers 11A and 11B is affected by heat from the other one of the power amplifiers 11A and 11B can be suppressed.

(5) Aspects

Aspects described below are disclosed herein.

According to a first aspect, a high frequency module (1) includes a mounting substrate (30), a power amplifier (11), a first electronic component (for example, a second switch 5), a plurality of external connection terminals (34), and a connecting member (17). The mounting substrate (30) has a first main surface (30*a*) and a second main surface (30*b*) that are opposite to each other. The power amplifier (11) and the first electronic component (for example, the second switch 5) are disposed on the second main surface (30*b*) of the mounting substrate (30). The plurality of external connection terminals (34) are disposed on the second main surface (30*b*) of the mounting substrate (30). The connecting member (17) is able to be connected to an external substrate (40). The plurality of external connection terminals (34) include a first external connection terminal (34) that is connected to the connecting member (17). The first external connection terminal (34) is disposed between the power amplifier (11) and the first electronic component (for example, the second switch 5).

With this arrangement, the power amplifier (11) is disposed on the second main surface (30*b*) (that is, a main surface near the connecting member (17)) of the mounting substrate (30). Thus, compared to the case where the power amplifier (11) is disposed on the first main surface (30*a*) of the mounting substrate (30), the distance between the power amplifier (11) and the external substrate (40) connected to the connecting member (17) can be shortened. Accordingly, heat (Q3) generated at the power amplifier (11) can be efficiently dissipated to the external substrate (40). As a result, heat dissipation characteristics of the power amplifier (11) can be improved.

Furthermore, the first external connection terminal (34) connected to the connecting member (17) is disposed between the power amplifier (11) and the first electronic component (for example, the second switch 5) on the second main surface (30*b*) of the mounting substrate (30). Thus, heat (Q1) transmitted from the power amplifier (11) to the mounting substrate (30) can be efficiently dissipated to the outside through the first external connection terminal (34) and the connecting member (17). Furthermore, in the state in which the external substrate (40) is connected to the connecting member (171), the heat (Q1) of the power amplifier (11) can be efficiently dissipated to the external substrate (40) through the first external connection terminal (34) and the connecting member (17). Thus, influence of heat generated at the power amplifier (11) on the first electronic component (for example, the second switch 5) can be suppressed.

As described above, the heat dissipation characteristics of the power amplifier (11) can be improved, and influence of the heat (Q1) generated at the power amplifier (11) on another electronic component (first electronic component) can be suppressed.

According to a second aspect, in the high frequency module (1) according to the first aspect, the power amplifier (11) is disposed on the second main surface (30*b*) of the mounting substrate (30) with a first metal member (38) interposed therebetween. The first external connection terminal (34) is disposed between the first metal member (38) and the first electronic component (for example, the second switch 5).

With this arrangement, due to the first external connection terminal (34), transmission of the heat (Q1), which is transmitted from the power amplifier (11) to the first metal member (38), to the external connection terminal (34) can be suppressed. Thus, influence of the heat (Q1) transmitted from the power amplifier (11) to the first metal member (38) on the first electronic component (for example, the second switch 5) can be suppressed.

According to a third aspect, the high frequency module (1) according to the second aspect further includes a conductive path (60). The conductive path (60) is provided at the mounting substrate (30) and allows connection between the first external connection terminal (34) and the first metal member (38).

With this arrangement, the heat (Q1) transmitted from the power amplifier (11) to the first metal member (38) can be quickly transmitted through the conductive path (60) to the external connection terminal (34).

According to a fourth aspect, in the high frequency module (1) according to any one of the first to third aspects, the power amplifier (11) and the first electronic component (for example, the second switch 5) are arranged next to each other.

With this arrangement, influence of the heat (Q1) generated at the power amplifier (11) on the first electronic component (for example, the second switch 5) next to the power amplifier (11) can be suppressed.

According to a fifth aspect, in the high frequency module (1) according to any one of the first to fourth aspects, the first external connection terminal includes a plurality of first external connection terminals (34). The plurality of first external connection terminals (34) are arranged in a direction (for example, the third direction D3) that intersects a direction (for example, the second direction D2) in which the power amplifier (11) and the first electronic component (for example, the second switch are arranged, in plan view from a thickness direction (D1) of the mounting substrate (30).

With this arrangement, influence of the heat (Q1) generated at the power amplifier (11) on the first electronic component (for example, the second switch 5) can further be suppressed.

According to a sixth aspect, the high frequency module (1) according to any one of the first to fifth aspects further includes a wiring layer (50). The wiring layer (50) has a third main surface (50a) and a fourth main surface (50b) that are opposite to each other, and the third main surface (50a) is between the second main surface (30b) of the mounting substrate (30) and the fourth main surface (50b). The first external connection terminal (34) is disposed between the second main surface (30b) of the mounting substrate (30) and the third main surface (50a) of the wiring layer (50). The connecting member (17) is disposed on the fourth main surface (50b) of the wiring layer (50).

With this arrangement, due to the redistribution layer (50), flexibility of relative arrangement of the connecting member (17) with respect to the first external connection terminal (34) can be improved.

According to a seventh aspect, the high frequency module (1) according to any one of the first to sixth aspects further includes a second metal member (114) that is disposed between the power amplifier (11) and the connecting member (17). The second metal member (114) is connected to the connecting member (17).

With this arrangement, heat (Q3) generated at the power amplifier (11) can be dissipated, through the second metal member (114) and the connecting member (17), to the external substrate (40) connected to the connecting member (17). Thus, the situation in which the heat (Q3) generated at the power amplifier (11) flows toward the first electronic component (for example, the second switch 5) can be suppressed. Accordingly, the flow rate of the heat (Q1) transmitted from the power amplifier (11) to the mounting substrate (30) can be reduced. As a result, influence of the heat (Q1) generated at the power amplifier (11) on the first electronic component (for example, the second switch 5) can further be suppressed.

According to an eighth aspect, the high frequency module (1) according to any one of the first to seventh aspects further includes an output matching circuit (13) that is connected to an output part of the power amplifier (11). The output matching circuit (13) is disposed inside the mounting substrate (30), the output matching circuit (13) and the power amplifier (11) overlap in plan view from a thickness direction (D1) of the mounting substrate (30), and the output matching circuit (13) is disposed closer to the second main surface (30b) than to the first main surface (30a) inside the mounting substrate (30).

With this arrangement, compared to the case where the output matching circuit (13) is disposed on the first main surface (30a) of the mounting substrate (30), a wiring path between the power amplifier (11) and the output matching circuit (13) can be shortened. Thus, loss of a transmission signal at the wiring path between the power amplifier (11) and the output matching circuit (13) can be reduced. Furthermore, leakage of a transmission signal to a reception circuit side from the wiring path between the power amplifier (11) and the output matching circuit (13) can be reduced.

According to a ninth aspect, the high frequency module (1) according to any one of the first to seventh aspects further includes a transformer (131) that is connected to an output part of the power amplifier (11). The transformer (131) is disposed inside the mounting substrate (30), the transformer (131) and the power amplifier (11) overlap in plan view from a thickness direction (D1) of the mounting substrate (30), and the transformer (131) is disposed closer to the second main surface (30b) than to the first main surface (30a) inside the mounting substrate (30).

With this arrangement, compared to the case where the transformer (131) is disposed on the first main surface (30a) of the mounting substrate (30), a wiring path between the power amplifier (11) and the transformer (131) can be shortened. Thus, loss of a transmission signal at the wiring path between the power amplifier (11) and the transformer (131) can be reduced. Furthermore, leakage of a transmission signal to a reception circuit side from the wiring path between the power amplifier (11) and the transformer (131) can be reduced.

According to a tenth aspect, in the high frequency module (1) according to any one of the first to ninth aspects, the first electronic component (for example, the second switch 5) is connected to a reception path through which a reception signal passes.

With this arrangement, due to the external connection terminals (34), isolation between the power amplifier (11), which is a transmission-system electronic component, and the reception-system first electronic component (for example, the second switch 5) can be ensured.

According to an eleventh aspect, in the high frequency module (1) according to any one of the first to tenth aspects, the first external connection terminal (34) is connected to a ground.

With this arrangement, the first external connection terminal (34) can function as an electromagnetic shielding member. Thus, the isolation between the power amplifier (11) and the first electronic component (for example, the second switch 5) can be ensured.

According to a twelfth aspect, in the high frequency module (1) according to the eleventh aspect, the plurality of external connection terminals (34) further include a plurality of second external connection terminals (34) that are connected to the connecting member (17). The plurality of second external connection terminals (34) are disposed on both sides of each of the power amplifier (11) and the first electronic component (for example, the second switch 5), in plan view from a thickness direction (D1) of the mounting substrate (30).

With this arrangement, isolation can be ensured on both sides of each of the first electronic component (for example, the second switch 5) and the power amplifier (11).

According to a thirteenth aspect, in the high frequency module (1) according to the twelfth aspect, the power amplifier includes a plurality of power amplifiers (11A, 11B). The plurality of second external connection terminals (34) are disposed near each of the plurality of power amplifiers (11A, 11B), in plan view from the thickness direction (D1) of the mounting substrate (30).

With this arrangement, a heat dissipation path for the power amplifier (11A) includes the external connection terminal (34A) near the power amplifier (11A) and other components, and a heat dissipation path for the power amplifier (11B) includes the external connection terminal (34B) near the power amplifier (11B) and other components. That is, the heat dissipation paths for the power amplifiers (11A, 11B) are isolated from each other. Thus, a situation in which one of the plurality of power amplifiers (11A, 11B) is affected by heat from the other one of the power amplifiers can be suppressed.

According to a fourteenth aspect, in the high frequency module (1) according to the tenth or eleventh aspect, the plurality of external connection terminals (34) further include a plurality of third external connection terminals (34) that are connected to the connecting member (17). The high frequency module (1) further includes a second electronic component (for example, the low noise amplifier 12) that is disposed on the second main surface (30b) of the mounting substrate (30). The plurality of third external connection terminals (34) are disposed on both sides of the second electronic component (for example, the low noise amplifier 12) in plan view from a thickness direction (D1) of the mounting substrate (30).

With this arrangement, isolation can be ensured on both sides of the second electronic component (for example, the low noise amplifier 12).

According to a fifteenth aspect, a communication apparatus (100) includes the high frequency module (1) according to any one of the first to fourteenth aspects and a signal processing circuit (2). The signal processing circuit (2) processes a high frequency signal passing through the high frequency module (1).

With this arrangement, the communication apparatus (100) including the high frequency module (1) having an effect described above can be provided.

The invention claimed is:

1. A high frequency module, comprising:
   a mounting substrate that has a first main surface and a second main surface that are opposite to each other;
   a power amplifier and a switch that are disposed on the second main surface of the mounting substrate;
   a plurality of external connection terminals that are disposed on the second main surface of the mounting substrate; and
   a connector that is able to be connected to an external substrate,
   wherein the plurality of external connection terminals include a first external connection terminal connected to the connector, and
   wherein the first external connection terminal is disposed between the power amplifier and the switch.

2. The high frequency module according to claim 1,
   wherein the power amplifier is disposed on the second main surface of the mounting substrate with a first metal member interposed therebetween, and
   wherein the first external connection terminal is disposed between the first metal member and the switch.

3. The high frequency module according to claim 2, further comprising a conductive path that is provided at the mounting substrate and allows connection between the first external connection terminal and the first metal member.

4. The high frequency module according to claim 1, wherein the power amplifier and the switch are arranged next to each other.

5. The high frequency module according to claim 1,
   wherein the first external connection terminal includes a plurality of first external connection terminals, and
   wherein the plurality of first external connection terminals are arranged in a direction that intersects a direction in which the power amplifier and the switch are arranged, in plan view from a thickness direction of the mounting substrate.

6. The high frequency module according to claim 1, further comprising:
   a wiring layer that has a third main surface and a fourth main surface that are opposite to each other, the third main surface being between the second main surface of the mounting substrate and the fourth main surface,
   wherein the first external connection terminal is disposed between the second main surface of the mounting substrate and the third main surface of the wiring layer, and
   wherein the connector is disposed on the fourth main surface of the wiring layer.

7. The high frequency module according to claim 1, further comprising a second metal member that is disposed between the power amplifier and the connector,
   wherein the second metal member is connected to the connector.

8. The high frequency module according to claim 1, further comprising an output matching circuit that is connected to an output part of the power amplifier,
   wherein the output matching circuit is disposed inside the mounting substrate, the output matching circuit and the power amplifier overlap in plan view from a thickness direction of the mounting substrate, and the output matching circuit is disposed closer to the second main surface than to the first main surface inside the mounting substrate.

9. The high frequency module according to claim 1, further comprising a transformer that is connected to an output part of the power amplifier,
   wherein the transformer is disposed inside the mounting substrate, the transformer and the power amplifier overlap in plan view from a thickness direction of the mounting substrate, and the transformer is disposed closer to the second main surface than to the first main surface inside the mounting substrate.

10. The high frequency module according to claim 1, wherein the switch is connected to a reception path through which a reception signal passes.

11. The high frequency module according to claim 1, wherein the first external connection terminal is connected to a ground.

12. The high frequency module according to claim 11,
   wherein the plurality of external connection terminals further include a plurality of second external connection terminals that are connected to the connector, and
   wherein the plurality of second external connection terminals are disposed on both sides of each of the power amplifier and the switch, in plan view from a thickness direction of the mounting substrate.

13. The high frequency module according to claim 12, wherein the power amplifier includes a plurality of power amplifiers, and wherein the plurality of second external connection terminals are disposed near each of the plurality of power amplifiers, in plan view from the thickness direction of the mounting substrate.

14. The high frequency module according to claim 10, wherein the plurality of external connection terminals further include a plurality of third external connection terminals that are connected to the connector, wherein the high frequency module further comprises a low noise amplifier that is disposed on the second main surface of the mounting substrate, and wherein the plurality of third external connection terminals are disposed on both sides of the low noise amplifier, in plan view from a thickness direction of the mounting substrate.

15. A communication apparatus, comprising:

a high frequency module including a mounting substrate that has a first main surface and a second main surface that are opposite to each other;

a power amplifier and a switch that are disposed on the second main surface of the mounting substrate;

a plurality of external connection terminals that are disposed on the second main surface of the mounting substrate; and a connector that is able to be connected to an external substrate, wherein the plurality of external connection terminals include a first external connection terminal connected to the connector, and wherein the first external connection terminal is disposed between the power amplifier and the switch; and a signal processing circuit that processes a high frequency signal passing through the high frequency module.

16. The high frequency module according to claim 11, wherein the plurality of external connection terminals further include a plurality of third external connection terminals that are connected to the connector, wherein the high frequency module further comprises a low noise amplifier that is disposed on the second main surface of the mounting substrate, and wherein the plurality of third external connection terminals are disposed on both sides of the low noise amplifier, in plan view from a thickness direction of the mounting substrate.

\* \* \* \* \*